(12) United States Patent
Kato et al.

(10) Patent No.: US 8,552,712 B2
(45) Date of Patent: Oct. 8, 2013

(54) CURRENT MEASUREMENT METHOD, INSPECTION METHOD OF SEMICONDUCTOR DEVICE, SEMICONDUCTOR DEVICE, AND TEST ELEMENT GROUP

(75) Inventors: Kiyoshi Kato, Kanagawa (JP); Yusuke Sekine, Kanagawa (JP); Yutaka Shionoiri, Kanagawa (JP); Kazuma Furutani, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 301 days.

(21) Appl. No.: 13/085,606

(22) Filed: Apr. 13, 2011

(65) Prior Publication Data

US 2011/0254538 A1 Oct. 20, 2011

(30) Foreign Application Priority Data

Apr. 16, 2010 (JP) ................................. 2010-094926

(51) Int. Cl.
*G01R 19/00* (2006.01)
*G01R 13/04* (2006.01)

(52) U.S. Cl.
USPC ........................ 324/123 R; 324/76.11; 702/64

(58) Field of Classification Search
None
See application file for complete search history.

(56) References Cited

U.S. PATENT DOCUMENTS

| | | | |
|---|---|---|---|
| 5,386,188 A * | 1/1995 | Minneman et al. | ........... 324/126 |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |

(Continued)

FOREIGN PATENT DOCUMENTS

| EP | 1 443 130 A1 | 4/2004 |
|---|---|---|
| EP | 1 443 130 A1 | 8/2004 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26. pp. 181-184.

(Continued)

*Primary Examiner* — Jermele M Hollington
*Assistant Examiner* — Trung Nguyen
(74) *Attorney, Agent, or Firm* — Fish & Richardson P.C.

(57) ABSTRACT

One object is to provide a method for measuring current by which minute current can be measured. A value of current flowing through an electrical element is not directly measured but is calculated from change in a potential observed in a predetermined period. The method for measuring current includes the steps of: applying a predetermined potential to a first terminal of an electrical element having the first terminal and a second terminal; measuring an amount of change in a potential of a node connected to the second terminal; and calculating, from the amount of change in the potential, a value of current flowing between the first terminal and the second terminal of the electrical element. Thus, the value of minute current can be measured.

9 Claims, 20 Drawing Sheets

(56) References Cited

U.S. PATENT DOCUMENTS

| | | |
|---|---|---|
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,353,123 B2 * | 4/2008 | Takakamo et al. ............ 702/64 |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0039670 A1 | 2/2005 | Hosono et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0148455 A1 | 6/2011 | Kato et al. |

FOREIGN PATENT DOCUMENTS

| | | |
|---|---|---|
| EP | 1 737 044 A1 | 12/2006 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hirao, T et al., "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphoreecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electronical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZNO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Kenji Nomura et al.; "Room-temperature fabrication of transparent flexible thin-film transistors using amorphous oxide semiconductors"; Nature; Nov. 25, 2004; pp. 488-492; vol. 432.

Ryo Hayashi et al.; "42.1: Invited Paper: Improved Amorphous In-Ga-Zn-O TFTs"; SID Digest '08 : SID International Symposium Digest of Technical Papers; May 20, 2008, pp. 621-624; vol. 39.

Kenji Nomura et al.; "Thin-Film Transistor Fabricated in Single-Crystalline Transparent Oxide Semiconductor"; Science; May 23, 2003; pp. 1269-1272; vol. 300, No. 5623.

Tung-Li Shen et al.; "A 2-ns Detecting Time, 2-μm CMOS Built-in Current Sensing Circuit"; IEEE Journal of Solid-State Circuits; 1993; pp. 72-77; vol. 28, No. 1.

Donald C. Thelen et al.; "A Low Noise Readout Detector Circuit for Nanoampere Sensor Applications"; IEEE Journal of Solid-State Circuits; Mar. 3, 1997; pp. 337-248; vol. 32, No. 3.

* cited by examiner

CURRENT MEASUREMENT METHOD, INSPECTION METHOD OF SEMICONDUCTOR DEVICE, SEMICONDUCTOR DEVICE, AND TEST ELEMENT GROUP

BACKGROUND OF THE INVENTION

1. Field of the Invention

The disclosed invention relates to a method for measuring a minute current flowing through an electrical element, an inspection method of a semiconductor device employing the current measurement method, a semiconductor device employing the current measurement method, a semiconductor device employing the inspection method, a test element group (also referred to as a TEG), and the like. Here, a semiconductor device may be any device which works by utilizing semiconductor characteristics. For example, a semiconductor device widely includes the following elements: a semiconductor element (including a so-called power device) such as a transistor, a diode, and a thyristor, an integrated circuit such as an image sensor, a memory, and a converter, an integrated circuit including the above elements, and a display device and the like typified by a liquid crystal display device.

2. Description of the Related Art

In recent years, research on thin film transistors using In—Ga—Zn based metal oxide has been actively conducted (see Patent Document 1, Non-Patent Document 1, and Non-Patent Document 2, for example). The research is proceeding with a view mainly to replacing silicon based thin film transistors used in display devices with thin film transistors using In—Ga—Zn based metal oxide.

By the way, in the case of manufacturing semiconductor devices that need charge retention, such as liquid crystal display devices, it is extremely important to know the characteristics of thin film transistors in an off state, e.g., the value of current flowing between a source and a drain of a transistor in an off state (hereinafter referred to as off-state current), and the like. This is because the parameters of a thin film transistor such as channel length and channel width are determined in accordance with the characteristics of the thin film transistor in an off state.

For now, it has been reported that the off-state current of a transistor using amorphous In—Ga—Zn based metal oxide is smaller than $1 \times 10^{-14}$ A (see Non-Patent Document 3, for example).

REFERENCE

[Patent Document]
[Patent Document 1] Japanese Published Patent Application No. 2004-103957
[Non-Patent Document]
[Non-Patent Document 1] K. Nomura, H. Ohta, K. Ueda, T. Kamiya, M. Hirano, and H. Hosono, "Thin-film transistor fabricated in single-crystalline transparent oxide semiconductor", SCIENCE, 2003, Vol. 300, pp. 1269-1272
[Non-Patent Document 2] K. Nomura, H. Ohta, A. Takagi, T. Kamiya, M. Hirano, and H. Hosono, "Room-temperature fabrication of transparent flexible thin-film transistors using amorphous oxide semiconductors", NATURE, 2004, Vol. 432, pp. 488-492
[Non-Patent Document 3] R. Hayashi, A. Sato, M. Ofuji, K. Abe, H. Yabuta, M. Sano, H. Kumomi, K. Nomura, T. Kamiya, M. Hirano, and H. Hosono, "Improved Amorphous In—Ga—Zn—O TFTs", SID DIGEST '08, pp. 621-624

SUMMARY OF THE INVENTION

However, as shown in Non-Patent Document 3, the lowest detection limit has been approximately 10 fA (femtoamperes (1 fA equals $10^{-15}$ A)) in measuring the off-state current, which is one of the transistor characteristics. For this reason, if the off-state current is lower than the lowest detection limit, it has been difficult to know its precise value.

Such a situation might cause a delay in developing electrical elements typified by thin film transistors. If the transistor characteristics cannot be precisely measured, the development of devices or circuits based on new characteristic values and the development of application products do not progress.

In view of the above problem, an object of one embodiment of the disclosed invention is to provide a current measurement method that enables a minute current to be measured, to provide an inspection method of a semiconductor device employing the current measurement method, to provide a semiconductor device employing the current measurement method, to provide a semiconductor device employing the inspection method, or to provide a test element group.

According to the disclosed invention, the value of current flowing through an electrical element is not directly measured, but is calculated from change in potential observed in a predetermined period. Specifically, current flowing through an electrical element is calculated from the amount of change in charge in a capacitor connected to the electrical element, whereby the value of a minute current can be measured, unlike a conventional method in which a voltage drop across a resistor is amplified and then read (e.g., pico-ammeters). The following method can be used, for example.

One embodiment of the present invention is a method for measuring current, including the steps of: applying a first potential to a first terminal of a transistor for evaluation; applying a second potential to a first terminal of a transistor for injection of charge; accumulating predetermined charge in a node where a second terminal of the transistor for evaluation and a second terminal of the transistor for injection of charge are connected to each other while the transistor for injection of charge is in an on state; turning off the transistor for injection of charge; measuring an amount of change in a potential of the node, due to change in an amount of the charge held in the node; and calculating a value of current flowing between the first terminal and the second terminal of the transistor for evaluation, from the amount of change in the potential.

In the above, accumulation of predetermined charge in the node and measurement of the amount of change in the potential of the node can be repeatedly performed.

Further, in the above, as the transistor for injection of charge, a transistor having L/W (L is a channel length and W is a channel width) larger than that of the transistor for evaluation can be used.

In the above, a capacitor can be connected to the node, thereby offering the advantage that the potential of the node is easily controlled.

It is possible to examine whether or not a transistor for evaluation has predetermined characteristics using the above current measurement method. Consequently, defects in a manufactured semiconductor device can be detected. Further, it is also possible to design a semiconductor device using a characteristic value measured by this inspection method. Consequently, yield of a semiconductor device can be increased.

It is possible to manufacture a semiconductor device by determining parameters of a transistor, which is a component of the semiconductor device, on the basis of the data on a current value obtained by the above current measurement method. Consequently, a semiconductor device having preferred characteristics can be provided.

One embodiment of the present invention is a test element group including a transistor for evaluation, a transistor for injection of charge, a capacitor, and an output circuit. A first terminal of the transistor for evaluation is a terminal to which a first potential is applied. A first terminal of the transistor for injection of charge is a terminal to which a second potential is applied. A second terminal of the transistor for evaluation, a second terminal of the transistor for injection of charge, a first terminal of the capacitor, and an input terminal of the output circuit are connected to one another.

In the above, L/W (L is a channel length and W is a channel width) of the transistor for injection of charge can be larger than that of the transistor for evaluation.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" are formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be interchanged in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of the "object having any electric function" include an electrode or a wiring; a switching element such as a transistor; a resistor; an inductor; a capacitor; and an element with any other functions (an electrical element).

Note that in the specification and the like, the charge accumulated in a node means charge accumulated in a capacitor of the node. Also, the capacitor of the node has capacitance of a capacitor, floating capacitance formed between wirings, parasitic capacitance formed in a transistor, which are connected to the node.

In one embodiment of the present invention, a value of current is calculated from change in a potential observed in a predetermined period. Thus, the value of a minute current can be measured.

Further, by examining whether or not an electrical element has predetermined characteristics using the above current measurement method, defects in a manufactured semiconductor device can be accurately detected.

A semiconductor device having preferred characteristics can be provided by determining parameters of an electrical element, which is a component of the semiconductor device, on the basis of on the data on a current value obtained by the above current measurement method.

Thus, according to one embodiment of the disclosed invention, a variety of technical effects can be obtained.

DETAILED DESCRIPTION OF THE INVENTION

Figure 1:
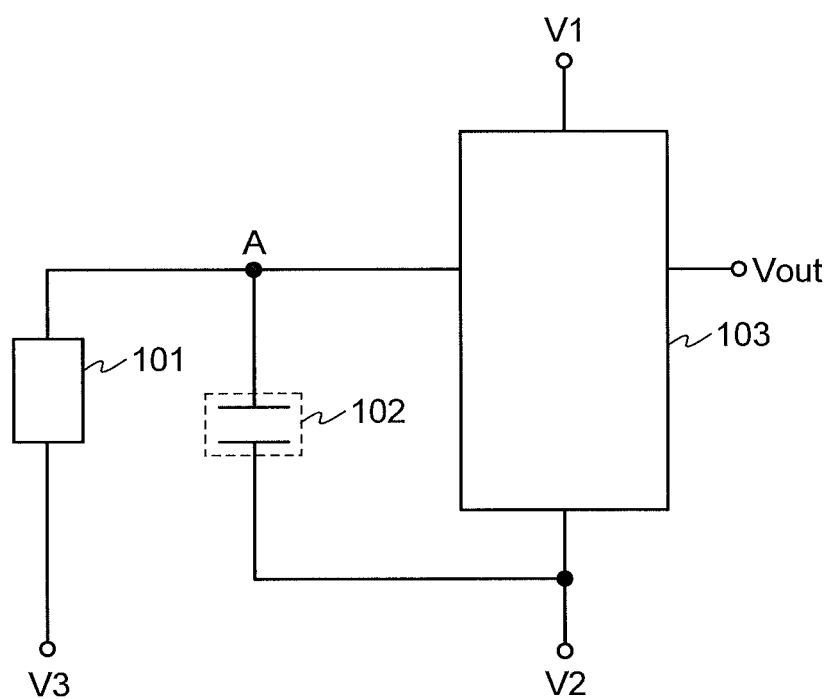
FIG. 1 is a circuit diagram illustrating an example of a measurement system.

Hereinafter, the embodiments and examples of the present invention will be described with reference to the drawings. Note that the present invention is not limited to the following description and it will be readily appreciated by those skilled in the art that modes and details can be modified in various ways without departing from the spirit and the scope of the present invention. Therefore, the present invention should not be construed as being limited to the description in the following embodiments.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

(Embodiment 1)

In this embodiment, an example of a current measurement method according to one embodiment of the disclosed invention and a measurement system used for the current measurement method will be described with reference to FIG. 1.

<Measurement System>

First, one example of a measurement system used for the current measurement method according to one embodiment of the disclosed invention will be described with reference to FIG. 1. The configuration of a measurement system below can be used as the configuration of a TEG Note that the measurement system described below is only an example, and the disclosed invention should not be construed as being limited thereto.

A measurement system illustrated in FIG. 1 includes an electrical element 101, a capacitor 102, and an output circuit 103. The electrical element 101 has a first terminal and a second terminal. The capacitor 102 has a first terminal and a second terminal. The output circuit 103 has an input terminal, an output terminal, a first terminal, and a second terminal.

In FIG. 1, the first terminal of the electrical element 101 is connected to a power source. The second terminal of the electrical element 101 is connected to the first terminal of the capacitor 102 and the input terminal of the output circuit 103. The second terminal of the capacitor 102 is connected to the second terminal of the output circuit 103 and a power source. The first terminal of the output circuit 103 is connected to a power source.

The power source supplies a potential V3 to the first terminal of the electrical element 101. Further, the power source supplies a potential V2 to the second terminal of the capacitor 102 and to the second terminal of the output circuit 103. Furthermore, the power source supplies a potential V1 to the first terminal of the output circuit 103. A potential Vout is output from the output terminal of the output circuit 103.

Note that the capacitor 102 is not necessarily provided. The capacitance of the output circuit 103 or the electrical element 101 can be used as the capacitor 102.

In addition, a control signal or a power supply potential other than those described above can be input to the electrical element 101 or the output circuit 103, depending on the configuration.

<Current Measurement Method>

Next, an example of a current measurement method using the above-described measurement system will be described with reference to FIGS. 2A and 2B and FIGS. 3A and 3B. Note that the current measurement method described below is only an example, and the disclosed invention should not be construed as being limited thereto.

First, a potential difference is generated between a node A, which is a node connected to the second terminal of the electrical element 101 (that is, a node connected to the first terminal of the capacitor 102 and the input terminal of the output circuit 103), and the first terminal of the capacitor 102, thereby allowing charge to flow through the electrical element 101. Then, a measurement period is started. In the measurement period, the potential of the first terminal of the electrical element 101 is fixed. On the other hand, the potential of the node A is not fixed (the node A is in a floating state) in the measurement period. Hence, charge flows through the electrical element 101, and the potential of the node A changes over time. The potential of the node A is changed depending on the change in the amount of charge stored in the node A. In other words, the output potential Vout of the output circuit 103 also changes.

The above-described application of a potential difference can be achieved by supplying charge to the node A and changing the potential of the node A. In the case where the conductance of the electrical element 101 is variable (e.g., the case where the electrical element 101 is a transistor or the like), the above-described application of a potential difference can be achieved by setting V3 high (or low) and applying this to the node A while the resistance of the electrical element 101 is set low, and then, setting the resistance of the electrical element 101 high and setting V3 low (or high). In addition, the above-described application of a potential difference can be achieved by making a difference between V2 and V3.

Figure 2A:
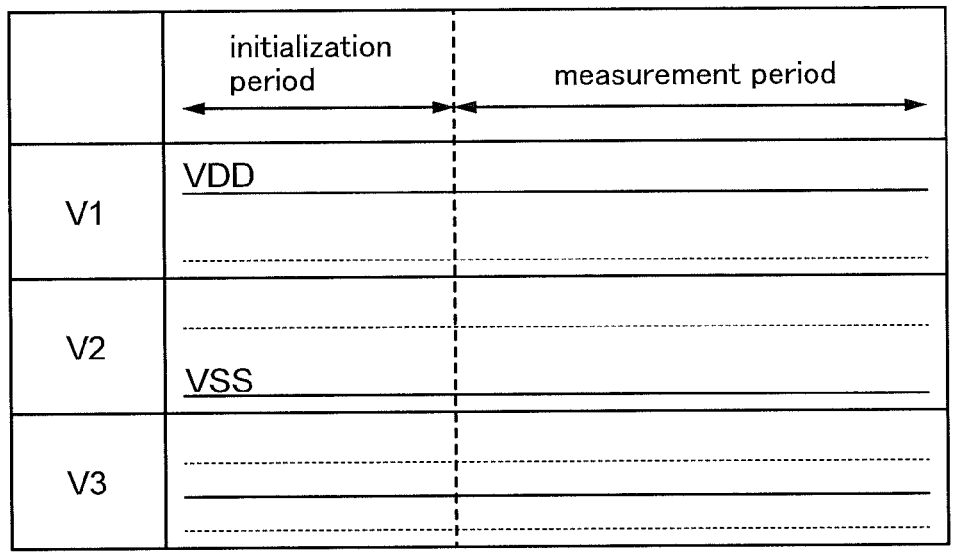
FIGS. 2A and 2B are views (timing charts) showing potentials relating to operation of a measurement system.
Figure 2B:
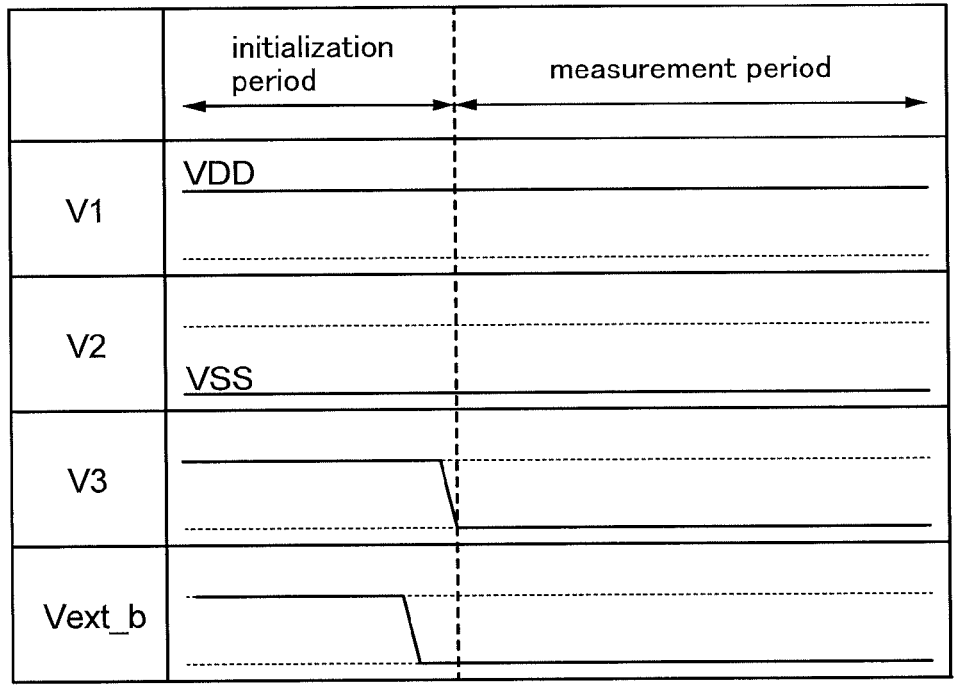

FIGS. 2A and 2B show a relation among the potentials (a timing chart) in the initialization period in which the potential difference is given and the subsequent measurement period. Here, two types of timing charts which are different in the method for giving a potential difference are shown.

FIG. 2A is an example of a timing chart in the case of using a method in which a potential is applied by supplying charge to the node A. In the initialization period, a probe needle or the like is forced into contact with the node A, and a desired potential is applied to the node A. After the application of the potential, the probe needle or the like is released from the node A, and the node A becomes floating. This method is characterized in that the potential V1, the potential V2, and the potential V3 do not need to be changed throughout the initialization period and the measurement period.

Note that in FIG. 2A, in the initialization period, V1 is VDD, but V1 may be VSS instead because V1 is a potential needed only in the measurement period. In addition, the potential V3 is set such that a desired potential is applied to the first terminal of the electrical element 101.

FIG. 2B is an example of a timing chart in the case where the conductance of the electrical element 101 is variable. In the timing chart, a potential Vext_b represents a potential that is applied to the electrical element 101 in order to vary the conductance of the electrical element. Note that a specific example of the electrical element 101 in this case is a transistor or the like. In the case where the electrical element 101 is a transistor, Vext_b is applied to a gate electrode of the transistor.

In the initialization period, the potential Vext_b is set to such a potential that the conductance of the electrical element 101 is increased. For example, when the electrical element 101 is a transistor, the potential Vext_b is set to such a potential that the transistor is turned on. In FIG. 2B, the potential Vext_b is high. In this state, the conductance of the electrical element 101 is high, so that the node A is charged with the potential V3. For this reason, in the initialization period, V3 is set so that the potential of the node A may become a desired potential.

In the subsequent measurement period, the potential Vext_b is set so that the electrical element 101 may go into a desired state for the measurement. In the case where the electrical element 101 is a transistor, for example, if the transistor in the off state is desired to be measured, the potential Vext_b is set so that the transistor may be turned off. In addition, the potential V3 is set so that charge may flow into the node A or charge may flow from the node A. Note that in order to hold the potential of the node A, it is preferable that V3 be changed after Vext_b is changed.

Note that in FIG. 2B, V3 and Vext_b are both high in the initialization period and low in the measurement period. One embodiment of the disclosed invention, however, is not limited to this; V3 and Vext_b may be low in the initialization period and high in the measurement period.

Figure 3A:
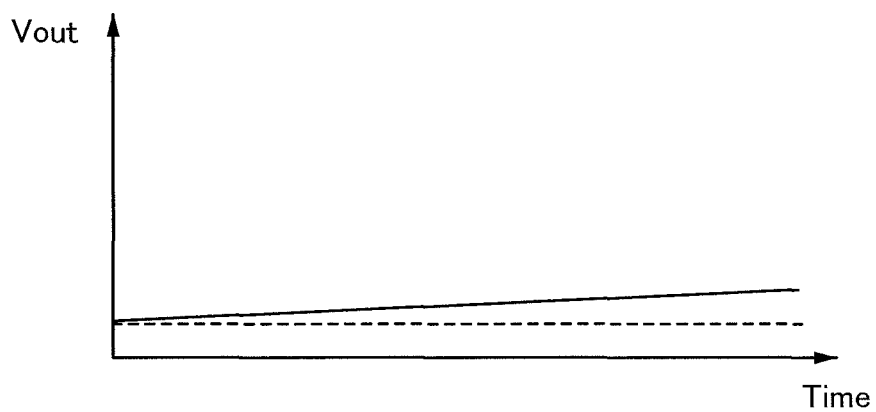
FIG. 3A is a graph showing an example of a relation between elapsed time Time and an output potential Vout and FIG. 3B is a graph showing an example of a relation between a potential VA and the output potential Vout.

When the measurement period starts after the above-described application of a potential difference, the amount of charge held in the capacitor connected to the node A changes over time, and the potential of the node A thus changes. This means that the potential of the input terminal of the output circuit 103 changes. Consequently, the potential of the output terminal of the output circuit 103 also changes over time. FIG. 3A shows an example of a relation between the elapsed time and the output potential Vout of the output circuit 103.

Figure 3B:
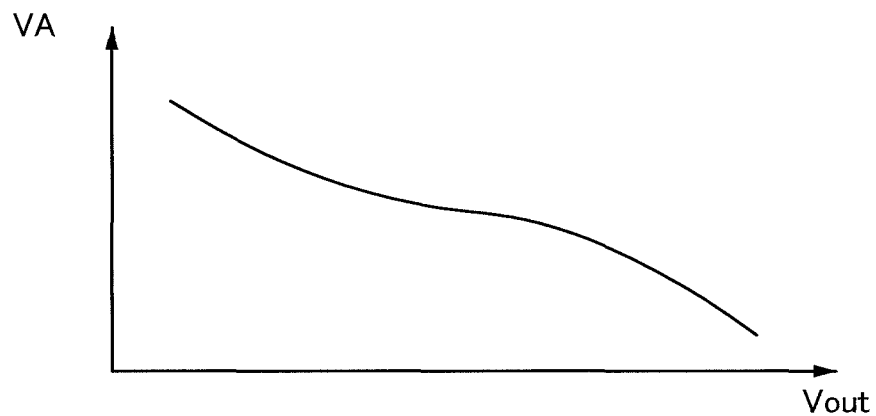

When a relation between the potential $V_A$ of the node A and the output potential Vout is obtained in advance, the potential $V_A$ of the node A can be obtained from the output potential Vout. FIG. 3B shows an example of the relation between the potential $V_A$ of the node A and the output potential Vout. In general, the potential $V_A$ of the node A can be expressed as a function of the output potential Vout by the following equation.

$$V_A = F(Vout) \quad \text{[Formula 1]}$$

Charge $Q_A$ of the capacitor connected to the node A can be expressed by the following equation using the potential $V_A$ of the node A, capacitance $C_A$ of the capacitor connected to the node A, and a constant (const). Here, the capacitance $C_A$ of the capacitor connected to the node A is the sum of the capacitance of the capacitor 102 and other capacitance (e.g., the input capacitance of the output circuit 103).

$$Q_A = C_A V_A + \text{const} \quad \text{[Formula 2]}$$

Current $I_A$ of the node A is the time derivatives of charge flowing to the node A (or charge flowing from the node A), so that the current $I_A$ of the node A is expressed by the following equation.

$$I_A \equiv \frac{\Delta Q_A}{\Delta t} = \frac{C_A \cdot \Delta F(Vout)}{\Delta t} \quad \text{[Formula 3]}$$

As described above, the current $I_A$ of the node A can be obtained from the capacitance $C_A$ of the capacitor connected to the node A and the output potential Vout of the output circuit 103.

Note that the current $I_A$ is the sum of $I_{dev}$ denoting current flowing through the electrical element 101 and $I_{leak}$ denoting current other than the current $I_{dev}$, so that in order to obtain the current $I_{dev}$ flowing through the electrical element 101 with high accuracy, the measurement is preferably carried out with a measurement system in which the current $I_{leak}$ is sufficiently smaller than the current $I_{dev}$ flowing through the electrical element 101. Alternatively, the accuracy in obtaining the current $I_{dev}$ flowing through the electrical element 101 may be increased by estimating the current $I_{leak}$ and then subtracting it from the current $I_A$.

Minute current flowing through an electrical element can be measured by the above-described method. For example, a current value of 1 zA (zeptoampere (1 zA equals $10^{-21}$ A)) or smaller, further, 1 yA (yoctoampere (1 yA equals $10^{-24}$ A)) can be measured by the method described in this embodiment.

The structures, methods, and the like described in this embodiment can be combined with any of the structures, methods, and the like described in the other embodiments as appropriate.

(Embodiment 2)

In this embodiment, other examples of the measurement system described in the above embodiment will be described with reference to FIGS. 4A to 4C, FIG. 5, FIG. 6, and FIGS. 7A and 7B. The configuration of a measurement system below can be used as the configuration of a TEG. Note that the measurement system below is only an example, and the disclosed invention should not be construed as being limited thereto.

<Measurement System>

Figure 4A:
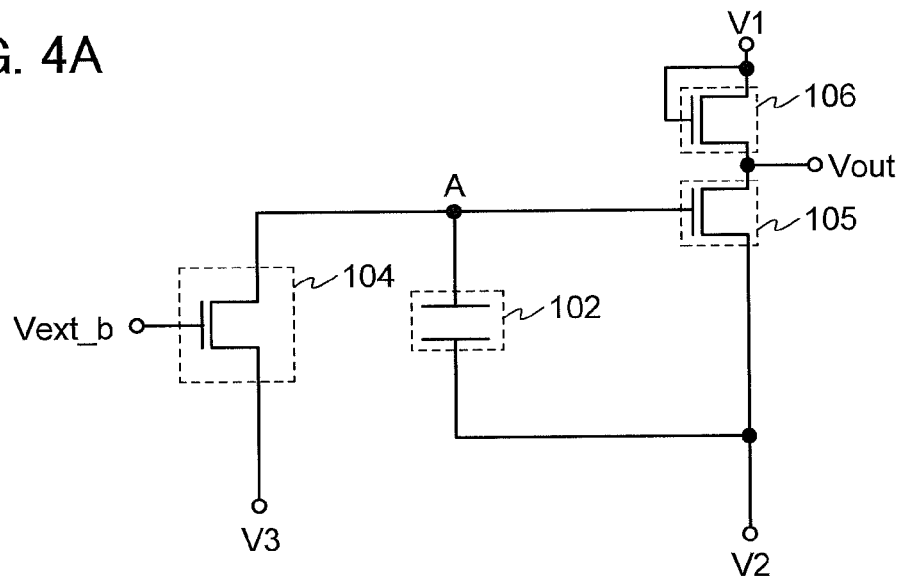
FIGS. 4A to 4C are circuit diagrams each illustrating an example of a measurement system.

A measurement system illustrated in FIG. 4A includes a capacitor 102, a transistor 104, a transistor 105, and a transistor 106. Here, the transistor 104 corresponds to the electrical element 101 in FIG. 1. Further, the transistor 105 and the transistor 106 constitute a circuit corresponding to the output circuit 103 in FIG. 1.

In FIG. 4A, a source terminal (or a drain terminal) of the transistor 104 corresponds to the first terminal of the electrical element 101 in FIG. 1. Further, the drain terminal (or the source terminal) of the transistor 104 corresponds to the second terminal of the electrical element 101.

In addition, in FIG. 4A, a source terminal (or a drain terminal) of the transistor 106 and a gate terminal of the transistor 106 are connected to each other, and thus constitute a terminal corresponding to the first terminal of the output circuit 103. Further, the drain terminal (or the source terminal) of the transistor 106 and a source terminal (or a drain terminal) of the transistor 105 are connected to each other, and thus constitute a terminal corresponding to the output terminal of the output circuit 103. Further, a gate terminal of the transistor 105 corresponds to the input terminal of the output circuit 103. Further, the drain terminal (or the source terminal) of the transistor 105 corresponds to the second terminal of the output circuit 103.

In other words, the source terminal (or the drain terminal) of the transistor 104 is connected to a power source. Further, the drain terminal (or the source terminal) of the transistor 104, a first terminal of the capacitor 102, and the gate terminal of the transistor 105 are electrically connected to one another. A second terminal of the capacitor 102 is connected to the drain terminal (or the source terminal) of the transistor 105 and the power source. Further, the source terminal (or the drain terminal) of the transistor 106 and the gate terminal of the transistor 106 are connected to the power source.

Note that the potential Vext_b by which the on/off of the transistor 104 is controlled is applied to the gate terminal of the transistor 104.

Figure 4B:
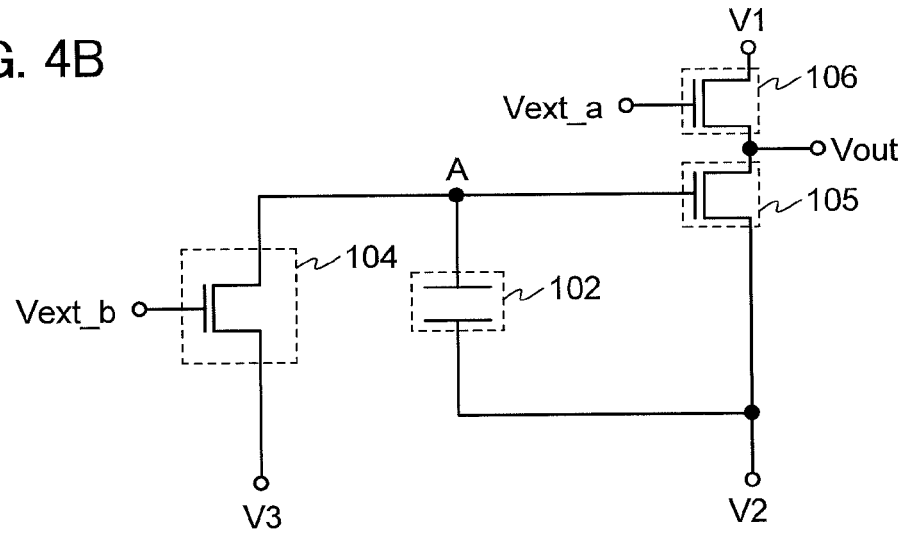

A measurement system illustrated in FIG. 4B has a configuration partly different from that illustrated in FIG. 4A. Portions different from those in FIG. 4A are described. In FIG. 4B, the source terminal (or the drain terminal) of the transistor 106 corresponds to the first terminal of the output circuit 103. Further, the potential Vext_a by which the on/off of the transistor 106 is controlled is applied to the gate terminal of the transistor 106. Further, the drain terminal (or the source terminal) of the transistor 106 and the source terminal (or the drain terminal) of the transistor 105 are connected to each other, and the output potential Vout is output from the terminal corresponding to the output terminal of the output circuit 103.

Figure 4C:
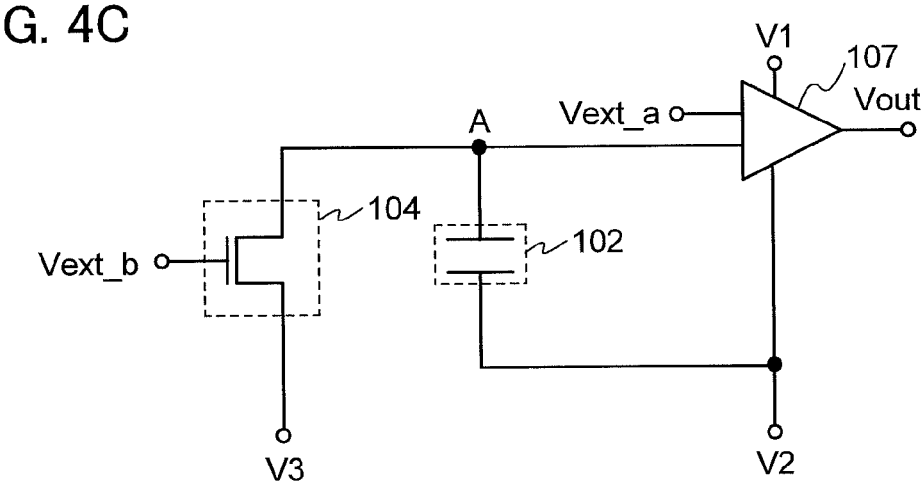

A measurement system illustrated in FIG. 4C has a configuration partly different from those described above. Portions different from those of the measurement systems described above will be described. In FIG. 4C, a sense amplifier circuit 107 constitutes a circuit corresponding to the output circuit 103 in FIG. 1. The sense amplifier circuit 107 has a first input terminal, a second input terminal, an output terminal, a first terminal, and a second terminal.

In the sense amplifier circuit 107, the potential Vext_a is supplied to the first input terminal. The second input terminal is electrically connected to the first terminal of the capacitor 102 and the drain terminal (or the source terminal) of the transistor 104. The first terminal of the sense amplifier circuit 107 is connected to the power source and the second terminal of the sense amplifier circuit 107 is electrically connected to the second terminal of the capacitor 102 and the power source.

Note that in the measurement system illustrated in FIG. 4B and the measurement system illustrated in FIG. 4C, change in the potential of the node A can be obtained with high accuracy by setting the potential Vext_a to an appropriate value.

Figure 5:
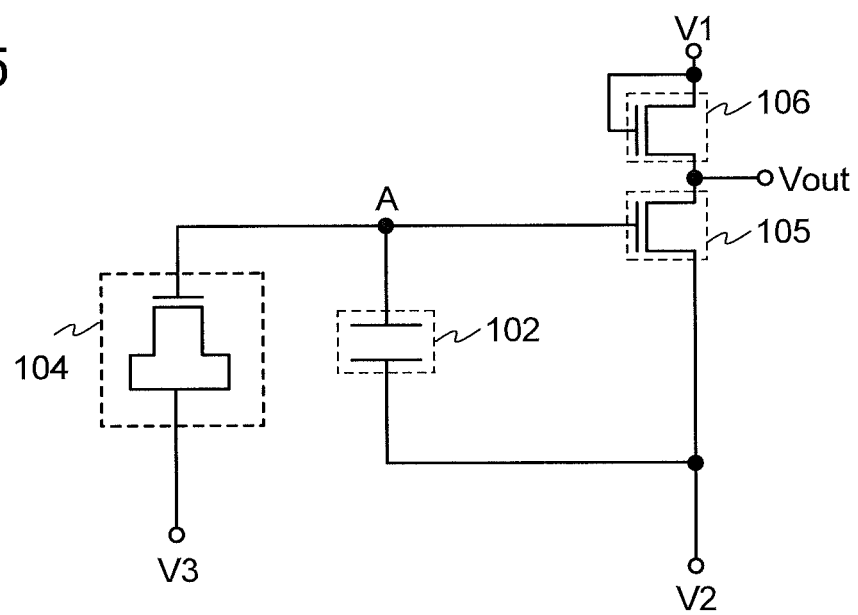
FIG. 5 is a circuit diagram illustrating an example of a measurement system.

A measurement system illustrated in FIG. 5 has a configuration partly different from that illustrated in FIG. 4A. Portions different from those in FIG. 4A are described. The measurement system in FIG. 5 is different from that in FIG. 4A in the connections of the transistor 104. In other words, in FIG. 5, the source terminal (or the drain terminal) of the transistor 104 and the drain terminal (or the source terminal) of the transistor 104 are connected to each other, and thus constitute the first terminal of the electrical element 101 in FIG. 1. Further, the gate terminal of the transistor 104 forms the second terminal of the electrical element 101.

As can be seen from the above configuration, the measurement system illustrated in FIG. 5 enables the measurement of the gate leakage current of the transistor 104.

Figure 6:
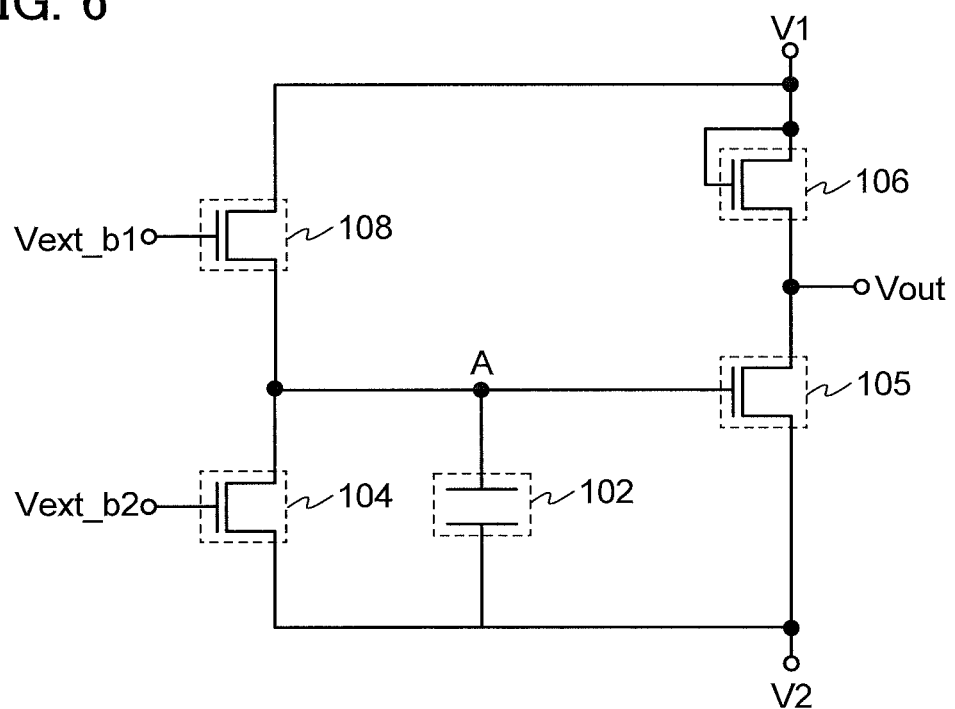
FIG. 6 is a circuit diagram illustrating an example of a measurement system.

A measurement system illustrated in FIG. 6 has a configuration partly different from that illustrated in FIG. 4A. Specifically, the measurement system in FIG. 6 includes a transistor 108 which is connected with the transistor 104 in series. Further, in FIG. 6, the power source supplying the potential V2 also serves as the power source which supplies the potential V3 in FIG. 4A. Here, portions different from those in FIG. 4A are described.

Thus, the source terminal (or the drain terminal) of the transistor 104, the second terminal of the capacitor 102, and the drain terminal (or the source terminal) of the transistor 105 are connected to the power source (which supplies V2). Further, the drain terminal (or the source terminal) of the transistor 104, a source terminal (or a drain terminal) of the transistor 108, the first terminal of the capacitor 102, and the gate terminal of the transistor 105 are electrically connected to one another. Further, the drain terminal (or the source terminal) of the transistor 108, the source terminal (or the drain terminal) of the transistor 106, and the gate terminal of the transistor 106 are connected to the power source (which supplies V1). Further, the drain terminal (or the source terminal) of the transistor 106 and the source terminal (or the drain terminal) of the transistor 105 are electrically connected to each other.

Note that a potential Vext_b2 for controlling the on/off of the transistor 104 is supplied to the gate terminal of the transistor 104, and a potential Vext_b1 for controlling the on/off of the transistor 108 is supplied to the gate terminal of the transistor 108.

As can be seen from the above configuration, in the measurement system illustrated in FIG. 6, the transistor 104 and the transistor 108 are connected in series. Hence, the transistor 104 enables charging and discharging performed in order to set the node A to the potential V2, and the transistor 108 enables charging and discharging performed in order to set the node A to the potential V1. In other words, the above configuration makes it possible to set the potential of the node A to more than one types of potential values by only interchanging the potential Vext_b1 and the Vext_b2.

<Timing Chart>

Figure 7A:
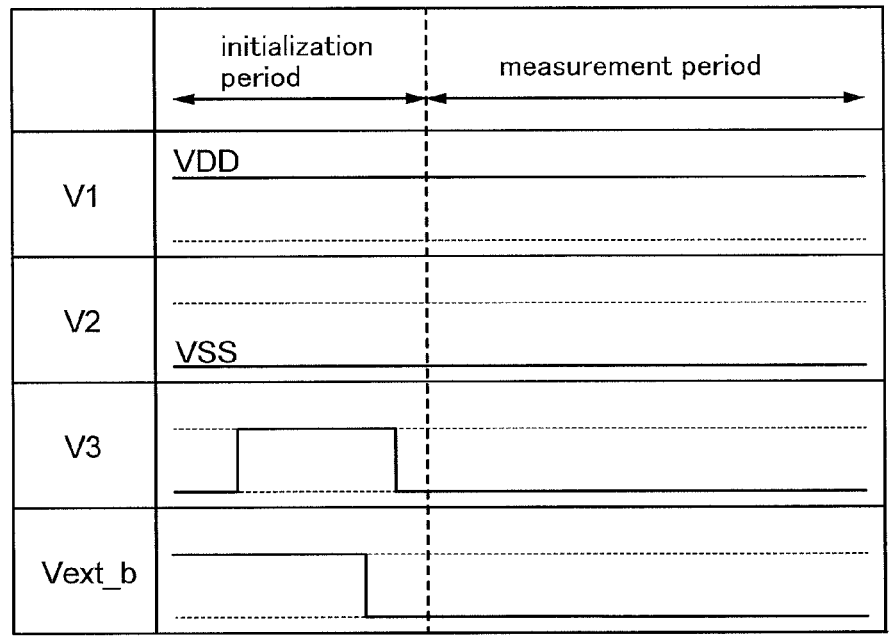
FIGS. 7A and 7B are views (timing charts) showing potentials relating to operation of a measurement system.
Figure 7B:
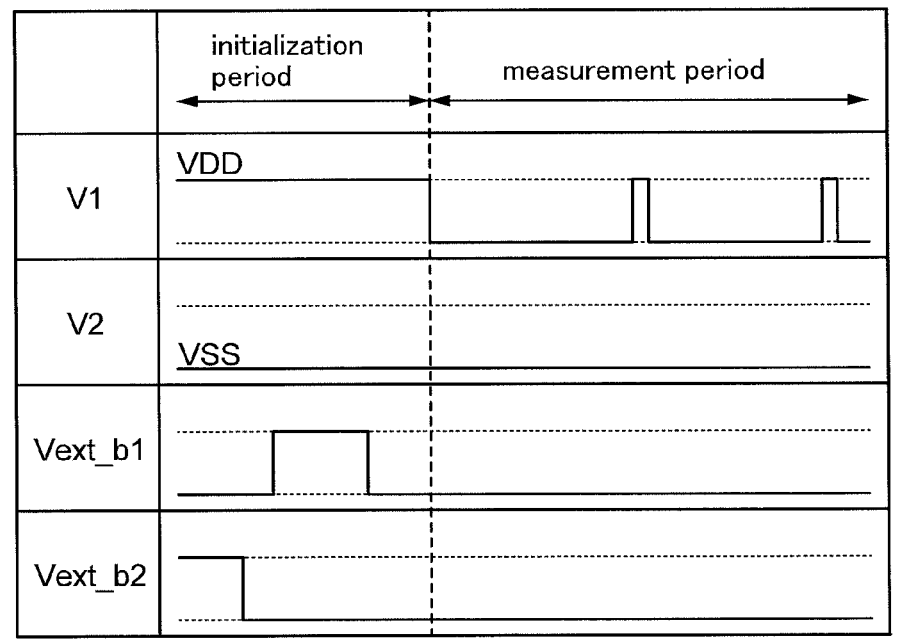

FIGS. 7A and 7B show a relation among the potentials (a timing chart) in the above measurement system. Here, two types of timing charts which are different in the type of measurement system are shown.

FIG. 7A is an example of the timing chart in the case of using the measurement system in FIG. 4A. In the initialization period, the potential Vext_b is set so that the transistor 104 may be turned on. Here, the potential Vext_b is high. In this state, current flows between the source and the drain of the transistor 104, so that the node A is charged with the potential V3. In the initialization period, V3 is set so that the potential of the node A may become a desired one.

In the subsequent measurement period, the potential Vext_b is set so that the transistor 104 may be turned off. In addition, the potential V3 is set so that charge may flow into the node A or charge may flow from the node A. Here, the potential V3 is low. Note that in order to hold the node A charged, it is preferable that the potential V3 be changed after the potential Vext_b is changed.

Note that in FIG. 7A, V3 and Vext_b are both high in the initialization period and low in the measurement period. One embodiment of the disclosed invention, however, is not limited to this; V3 and Vext_b may be low in the initialization period and high in the measurement period.

Note that the timing chart of FIG. 7A can be applied to the case of using the measurement system illustrated in FIG. 4B or FIG. 4C.

FIG. 7B is an example of the timing chart in the case of using the measurement system in FIG. 6. In the initialization period, the potential Vext_b2 is set so that the transistor 104 may be turned on. Consequently, the potential of the node A becomes V2, that is, a low potential (VSS). Then, the potential Vext_b2 is set so that the transistor 104 is turned off, and the transistor 104 is thus turned off. In a next step, the potential Vext_b1 is set so that the transistor 108 is turned on. Thus, the potential of the node A comes to be V1, that is, a high potential (VDD). Subsequently, the potential Vext_b1 is set so that the transistor 108 is turned off. Consequently, the node A becomes floating, and the initialization period is terminated.

In the following measurement period, the potential V1 and the potential V2 are individually set to potentials at which charge flows to or from the node A. Here, the potential V1 and the potential V2 are low potentials (VSS). Note that it is necessary to operate the output circuit at the timing of measuring the output potential Vout; thus, V1 is set to a high potential (VDD) temporarily.

By using the data obtained by the above operation for the method described in the above embodiment, off-state current of a transistor can be calculated.

The structures and methods described in this embodiment can be combined as appropriate with any of the structures and methods described in the other embodiments.

(Embodiment 3)

In this embodiment, other examples of the measurement system described in the above embodiments will be described with reference to FIG. 8, FIG. 9, and FIG. 10. The configuration of a measurement system below can be used as the configuration of a TEG.

<Measurement System>

Figure 8:
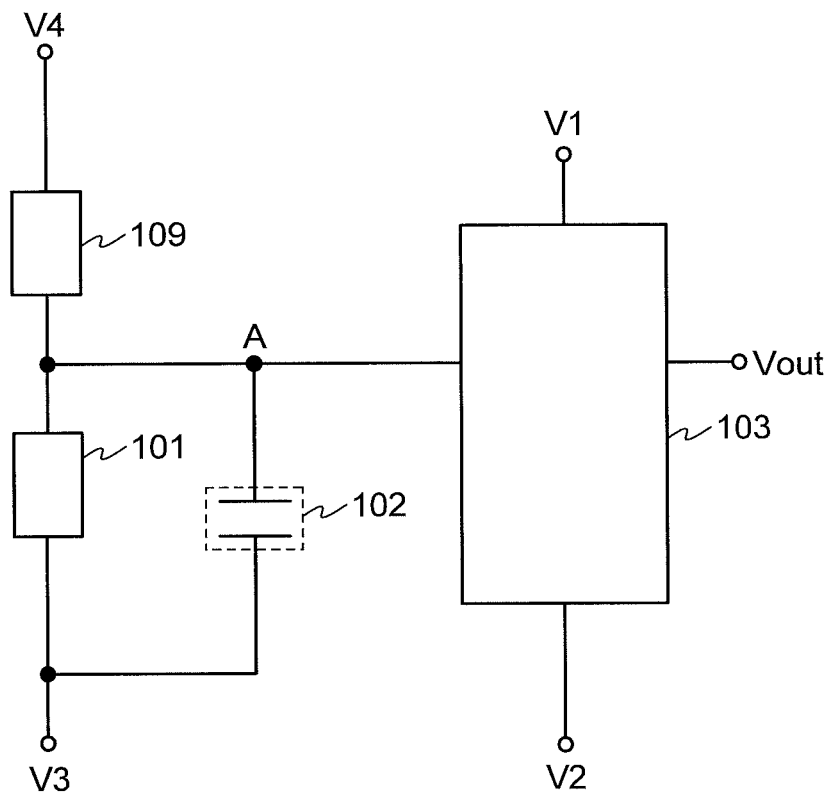
FIG. 8 is a circuit diagram illustrating an example of a measurement system.

A measurement system illustrated in FIG. 8 has a structure partly different from that illustrated in FIG. 1. Portions different from those in FIG. 1 will be described. A structure illustrated in FIG. 8 includes, in addition to the components illustrated in FIG. 1, an electrical element 109. The electrical element 109 has a first terminal and a second terminal.

In FIG. 8, the second terminal of the electrical element 101 is connected to the first terminal of the electrical element 109, the first terminal of the capacitor 102, and the input terminal of the output circuit 103. The second terminal of the electrical element 109 is connected to a power source or a signal source. The first terminal of the electrical element 101 and the second terminal of the capacitor 102 are connected to a power source or a signal source.

In the above structure, V3 is applied from the power source or the signal source to the first terminal of the electrical element 101 and the second terminal of the capacitor 102. Further, V4 is applied from the power source or the signal source to the second terminal of the electrical element 109. Furthermore, V1 is applied from the power source or the signal source to the first terminal of the output circuit 103, V2 is applied from the power source or the signal source to the second terminal of the output circuit 103, and the potential Vout is output from the output terminal of the output circuit 103.

Figure 9:
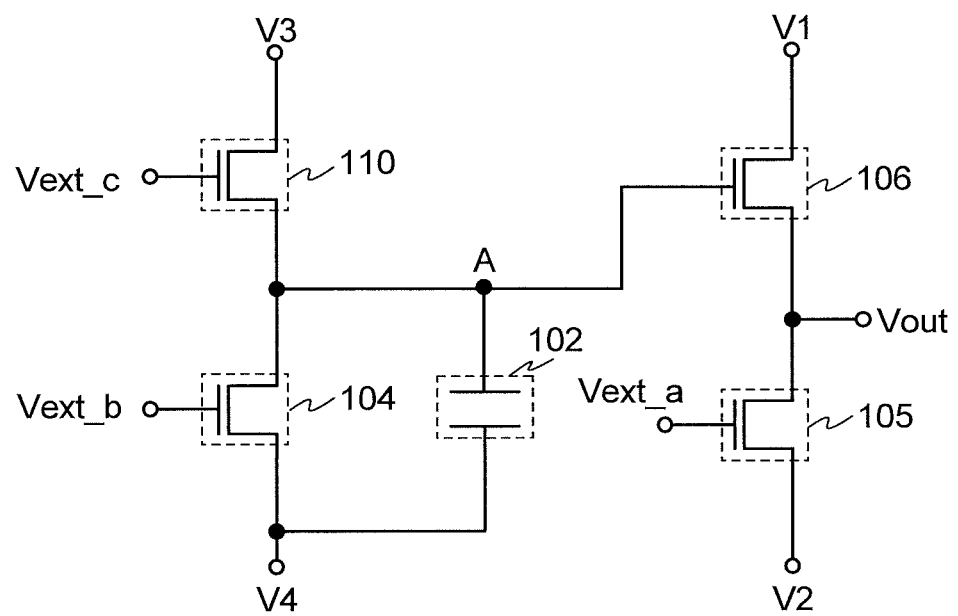
FIG. 9 is a circuit diagram illustrating an example of a measurement system.

A measurement system illustrated in FIG. 9 is a specific measurement system illustrated in FIG. 8, and is partly different from the measurement system illustrated in FIG. 6. In the measurement system illustrated in FIG. 6, the transistor 104 is used for injection of charge and evaluation of leakage current; on the contrary, in the measurement system illustrated in FIG. 9, a transistor for injection of charge and a transistor for evaluation of leakage current are separately provided. Here, the transistor 104 is a transistor for evaluation of leakage current and a transistor 110 is a transistor for injection of charge.

When a transistor for injection of charge and a transistor for evaluation are separately provided, the transistor for evaluation can be always kept in an off state at the time of injection of charge. In the case where a transistor for injection of charge is not provided, the transistor for evaluation needs to be turned on once at the time of injection of charge; accordingly, it takes longer time for measurement when an element which takes time to be in a steady state of an off state from an on state is used.

Moreover, when a transistor for injection of charge and a transistor for evaluation are separately provided, each transistor can have an appropriate size. For example, the channel width W of the transistor for evaluation is preferably larger than that of the transistor for injection of charge. When the channel width W of the transistor for evaluation is larger than that of the transistor for injection of charge, a leakage current other than leakage current of the transistor for evaluation can be relatively reduced. As a result, the leakage current of the transistor for evaluation can be measured with high accuracy. At the same time, the transistor for evaluation does not need to be turned on once, so that there is no influence of change in the potential of the node A, due to flow of part of charge in a channel formation region into the node A.

On the other hand, when the channel width W of the transistor for injection of charge is smaller than that of the transistor for evaluation, leakage current of the transistor for injection of charge can be relatively reduced. Further, change in the potential of the node A, due to flow of part of the charge in the channel formation region into the node A, has little influence at the time of injection of charge.

In the measurement system illustrated in FIG. 9, the drain terminal (or the source terminal) of the transistor 104, a source terminal (or a drain terminal) of the transistor 110, and the first terminal of the capacitor 102 are connected to the gate terminal of the transistor 106. The source terminal (or the drain terminal) of the transistor 104 is connected to the second terminal of the capacitor 102. The drain terminal (or the source terminal) of the transistor 110 is connected to a power source, the source terminal (or the drain terminal) of the transistor 106 is connected to a power source, and the drain terminal (or the source terminal) of the transistor 105 is connected to a power source.

In the measurement system illustrated in FIG. 9, a potential V4 is applied from a power source to the source terminal (or the drain terminal) of the transistor 104, and V3 is applied from the power source to the drain terminal (or the source terminal) of the transistor 110. Further, V1 is applied from the power source to the source terminal (or the drain terminal) of the transistor 106, and V2 is applied from the power source to the drain terminal (or the source terminal) of the transistor 105. Furthermore, the output potential Vout is output from a terminal corresponding to the output terminal of the output circuit 103, to which the source terminal (or the drain terminal) of the transistor 105 is connected.

In the above structure, a potential Vext_c for controlling the on/off of the transistor 110 is supplied to a gate terminal of the transistor 110, the potential Vext_b for controlling a state of the transistor for evaluation is supplied to the gate terminal of the transistor 104, and the potential Vext_a for adjusting the output circuit 103 is supplied to the gate terminal of the transistor 105.

<Timing Chart>

Figure 10:
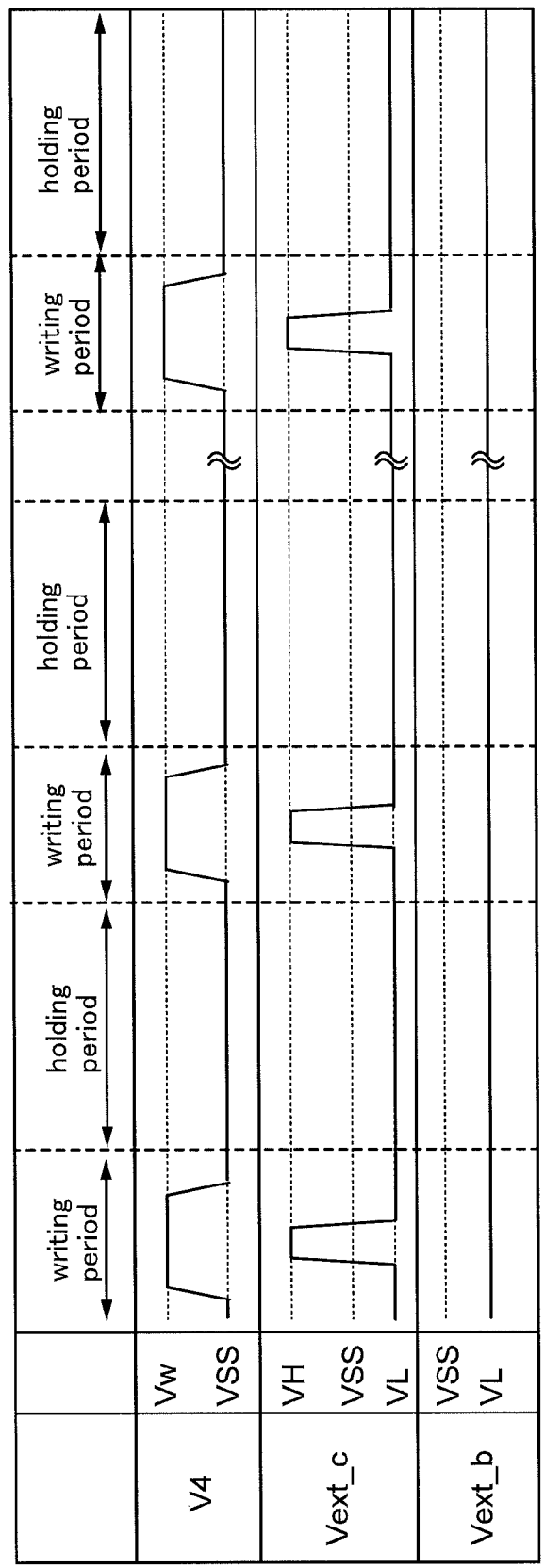
FIG. 10 is a view (timing chart) showing potentials relating to operation of a measurement system.

FIG. 10 shows a relation among potentials in the measurement system illustrated in FIG. 9. In a writing period, the potential Vext_b is set to a potential VL so that the transistor 104 may be in an off state. After V4 is set to a writing potential Vw, Vext_c is set to a potential VH for a certain period so that the transistor 110 may be turned on. Thus, charge is accumulated in the node A. For example, when the potential VH is larger than the sum of the potential Vw and the threshold voltage of the transistor for injection of charge, the potential of the node A is Vw. After that, Vext_c is set to the potential VL so that the transistor 110 may be turned off. Then, V4 is set to a potential VSS. Thus, the writing period is terminated and a holding period is started. In the holding period, an amount of change in the potential of the node A, due to change in an amount of the charge held in the node A, is measured. A value of current flowing between the first terminal and the second terminal of the transistor for evaluation can be calculated from the amount of change in the potential. In such a manner, accumulation of charge in the node A and measurement of the amount of change in the potential of the node A can be performed.

Accumulation of charge in the node A and measurement of the amount of change in the potential of the node A are preferably performed repeatedly. When accumulation of charge in the node A and measurement of the amount of change in the potential of the node A are performed repeatedly, it can be confirmed that the measured value of current is a value in a steady state. In other words, transient current (current which is reducing from start of measurement as time passes) can be removed from the current IA flowing through the node A. As a result, leakage current can be measured with higher accuracy.

Further, when a wiring period and a holding period are collectively called as a measurement period, measurement periods with a different potential Vw may be successively performed. In such a manner, an influence on a transistor for evaluation in an off state can be suppressed and leakage current against a desired potential of the node A can be measured.

Further, in the case where particularly minute leakage current is measured, capacitance of the node A is preferably small Note that the capacitor 102 is not necessarily provided. Parasitic capacitance between the source terminal (or the drain terminal) and the gate terminal of the transistor for evaluation is also preferably small. For example, a structure in which a gate electrode does not overlap with a source electrode is preferable.

Minute current flowing through an electrical element can be measured by the above-described method. For example, a current value of 1 zA (zeptoampere (1 zA equals $10^{-21}$ A)) or smaller, further, 1 yA (yoctoampere (1 yA equals $10^{-24}$ A)) can be measured by the method described in this embodiment.

The structures, methods, and the like described in this embodiment can be combined with any of the structures, methods, and the like described in the other embodiments as appropriate.

(Embodiment 4)

In this embodiment, a modification example or the like of the measurement system described in the above embodiments will be described with reference to FIG. 11. The configuration of a measurement system below can be used as the configuration of a TEG. Note that the measurement system below is only an example, and the disclosed invention should not be construed as being limited thereto.

<Measurement System>

Figure 11:
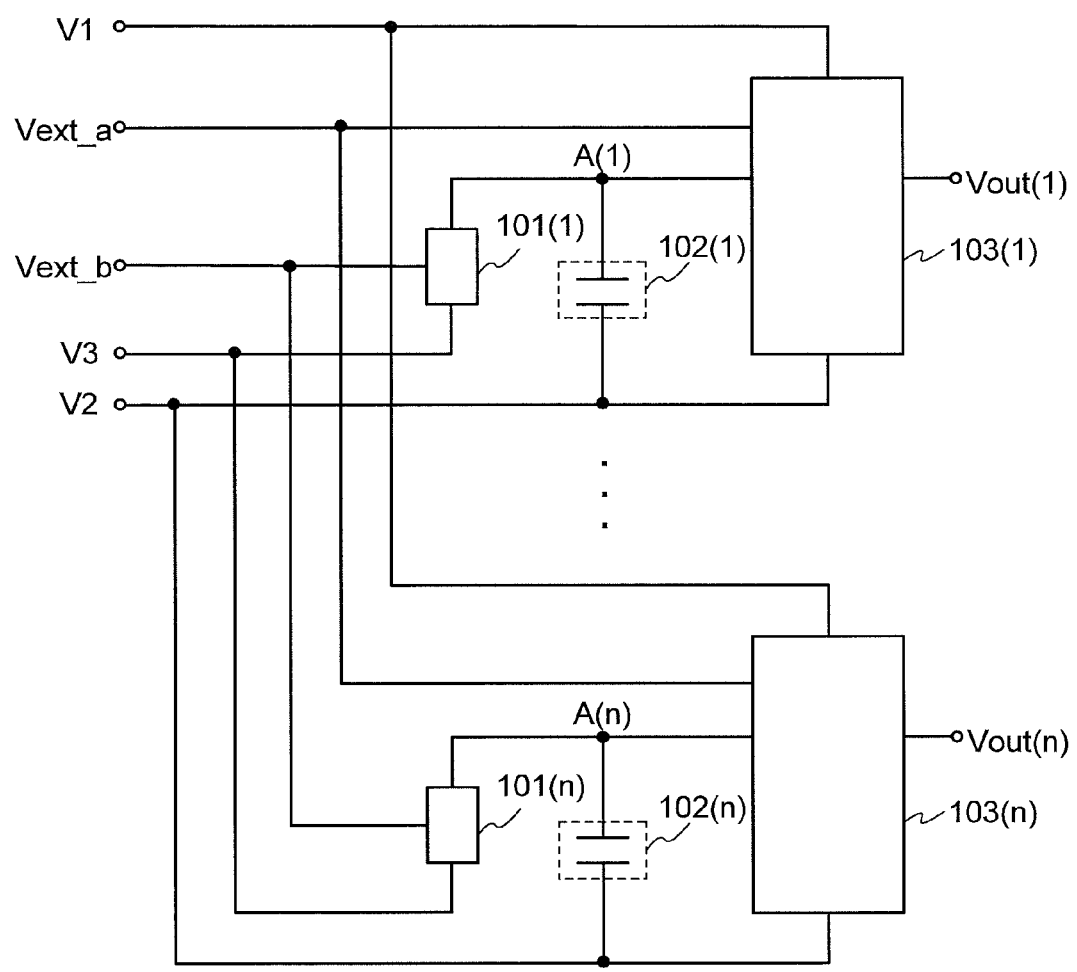
FIG. 11 is a circuit diagram illustrating an example of a measurement system.

In a measurement system illustrated in FIG. 11, a plurality of measurement systems (n measurement systems) similar to the measurement system illustrated in FIG. 1 is connected in parallel. Specifically, the measurement system illustrated in FIG. 11 includes electrical elements 101(1) to 101(n), capacitors 102(1) to 102(n), and output circuits 103(1) to 103(n).

Connections between the elements are the same as those in the measurement system illustrated in FIG. 1. The above embodiment can be referred to for details. Note that in the measurement system illustrated in FIG. 11, the electrical elements 101(1) to 101(n) each have a third terminal, and the potential Vext_b is applied to each of the third terminals of the electrical elements 101(1) to 101(n) in order to control the conductance of the electrical elements 101(1) to 101(n). Further, the output circuits 103(1) to 103(n) each have a second input terminal, and the potential Vext_a is applied to the second input terminal.

Although the case where the plurality of measurement systems similar to the measurement system illustrated in FIG. 1 is connected in parallel is described in this embodiment, a plurality of measurement systems similar to the measurement system illustrated in FIG. 8 can be connected in parallel.

<Current Measurement Method>

The current measurement method is basically the same as that described in the above embodiment. The above embodiment can be referred to for details.

The measurement system in this embodiment has the advantage of being capable of performing a great number of measurements with small resources because its plurality of parallel-connected measurement systems shares the power source and the like. The current measurement method according to one embodiment of the disclosed invention is based on the measurement of change in potential through time, and the current measurement thus requires some time in some cases.

In view of this, such a parallel connection of measurement systems described in this embodiment produces a significant effect.

Further, it is possible to reduce the influence of noise in the potential V1, the potential V2, the potential V3, the potential Vext_a, the potential Vext_b, and the like input from outside by determining difference in the output potential of the plurality of parallel-connected circuits.

In addition, the plurality of parallel-connected measurement systems makes it possible to obtain the value of current flowing through an electrical element without considering current other than the current flowing through the electrical element or parasitic capacitance by changing the conditions of the electrical element or the capacitor, and thus can increase the accuracy of the current measurement.

<Method of Removing Current $I_{leak}$>

A method for obtaining current flowing through an electrical element without considering current other than the current flowing through the electrical element will be described below as an example. Note that here, the conditions of each electrical element are changed on the assumption that the capacitance of the node A (including the capacitance of the capacitor) is the same among the parallel-connected measurement systems.

A measurement system 1, the parameter of which is $\alpha_1$, and a measurement system 2, the parameter of which is $\alpha_2$, are prepared, for example. Here, parameter $\alpha$, which is one of the parameters of an electrical element, is proportional to current flowing through the electrical element. Note that in the case where the electrical element is a transistor, an example of the parameter $\alpha$ is the channel width W.

As described in the above embodiment, current flowing through the node A is the sum of the current $I_{dev}$ flowing through the electrical element and other current $L_{leak}$. Therefore, $I_{A1}$ denoting current flowing through a node A(1) in the measurement system 1, and $I_{A2}$ denoting current flowing through a node A(2) in the measurement system 2, are expressed by the following equations, where the current $I_{dev0}$ is current per unit $\alpha$ flowing through the node A (meaning that the current $I_{dev}$ in the measurement system 1 equals $I_{dev0} \cdot \alpha_1$, and the current $I_{dev}$ in the measurement system 2 equals $I_{dev0} \cdot \alpha_2$).

$$I_{A1} = I_{dev0} \cdot \alpha_1 + I_{leak} \quad \text{[Formula 4]}$$

$$I_{A2} = I_{dev0} \cdot \alpha_2 + I_{leak} \quad \text{[Formula 5]}$$

$I_{dev0}$ is therefore expressed by the following equation.

$$I_{dev0} = \frac{I_{A2} - I_{A1}}{\alpha_2 - \alpha_1} \quad \text{[Formula 6]}$$

The above equation shows that $I_{dev0}$ does not include the current $I_{leak}$. Consequently, current flowing through an electrical element can be obtained with high accuracy even when unknown $I_{leak}$ exists in a measurement system. Note that it is preferable to carry out an analysis on the condition that $V_{A1}$ and $V_{A2}$ denoting the potentials of the nodes A are substantially the same for the reason that $I_{A1}$ and $I_{A2}$ depend on the potential of the node A. In other words, it is preferable to carry out an analysis on the condition that $V_{out1}$ and $V_{out2}$ are substantially the same because the configurations of the output circuits are substantially the same among the plurality of parallel-connected measurement systems.

<Method of Removing Parasitic Capacitance>

A method for obtaining the value of current flowing through an electrical element without considering parasitic capacitance C' will be described below as an example. Note that here, the conditions of a capacitor connected to the node A are changed on the assumption that the electrical elements are the same among the parallel-connected measurement systems.

The measurement system 1 in which the capacitance of a capacitor is expressed as $C_1$ and the measurement system 2 in which the capacitance of a capacitor is expressed as $C_2$ are prepared, for example. This means that in the measurement system 1, the capacitance of the node A(1) including parasitic capacitance is expressed as $C_1+C'$, and in the measurement system 2, the capacitance of the node A(2) including parasitic capacitance is expressed as $C_2+C'$.

The current $I_A$ flowing through an electrical element is not dependent on the value of the capacitance of the node A if the potentials of the nodes A are the same among the parallel-connected measurement systems, so that the expression $I_{A1}=I_{A2}$ is satisfied. Thus, the following equation is given by using $I_{A1}$ and $I_{A2}$.

$$I_A = (C_2 + C')\frac{\Delta V_{A2}}{\Delta t} = (C_1 + C')\frac{\Delta V_{A1}}{\Delta t} \qquad \text{[Formula 7]}$$

C' is therefore expressed by the following equation.

$$C' = \frac{C_2 \cdot \frac{\Delta V_{A2}}{\Delta t} - C_1 \cdot \frac{\Delta V_{A1}}{\Delta t}}{\frac{\Delta V_{A1}}{\Delta t} - \frac{\Delta V_{A2}}{\Delta t}} \qquad \text{[Formula 8]}$$

The current $I_A$ is expressed by the following expression substituting the above C'.

$$I_A = \frac{(C_2 - C_1)\frac{\Delta V_{A2}}{\Delta t} \cdot \frac{\Delta V_{A1}}{\Delta t}}{\frac{\Delta V_{A1}}{\Delta t} - \frac{\Delta V_{A2}}{\Delta t}} \qquad \text{[Formula 9]}$$

The above equation shows that $I_A$ does not include capacitance other than $C_1$ and $C_2$. Consequently, the current $I_A$ flowing through the electrical element can be obtained with high accuracy even when unknown C' exists in a measurement system. Note that it is preferable to carry out an analysis on the condition that $V_{A1}$ and $V_{A2}$ denoting the potentials of the nodes A are substantially the same for the reason that $I_{A1}$ and $I_{A2}$ depend on the potential of the node A. In other words, it is preferable to carry out an analysis on the condition that $V_{out1}$ and $V_{out2}$ are substantially the same because the configurations of the output circuits are substantially the same among the plurality of parallel-connected measurement systems.

The structures, methods, and the like described in this embodiment can be combined with any of the structures, methods, and the like described in the other embodiments as appropriate.

(Embodiment 5)

It is possible to examine whether or not an electrical element has predetermined characteristics by using the current measurement method described in the above embodiments.

For example, when a capacitor is used as the electrical element, it is possible to examine whether or not the value of current leaking between the terminals of the capacitor is below a reference value. In addition, when a transistor is used as the electrical element, it is possible to examine whether or not the off-state current of the transistor is below a reference value, or to examine whether or not the gate leakage current of the transistor is below a reference value.

Further, when the above inspection method is employed in the manufacturing process of a semiconductor device, defects in the semiconductor device can be accurately discovered.

The structures, methods, and the like described in this embodiment can be combined with any of the structures, methods, and the like described in the other embodiments as appropriate.

(Embodiment 6)

It is possible to provide a semiconductor device having preferred characteristics by determining the parameters of an electrical element with the use of the current measurement method described in the above embodiments.

For example, measuring the off-state current of a transistor accurately makes it possible to obtain a minimum drive frequency or an optimum value for the channel width W of a transistor included in a semiconductor device that needs charge retention, such as a liquid crystal display. Thus, a semiconductor device with reduced power consumption can be achieved.

The structures, methods, and the like described in this embodiment can be combined with any of the structures, methods, and the like described in the other embodiments as appropriate.

(Embodiment 7)

In this embodiment, a method for manufacturing a semiconductor device including an oxide semiconductor (particularly an amorphous structure) will be described with reference to FIGS. 12A to 12E. A semiconductor device of this embodiment can be used as the electrical element 101 (e.g., the transistor 104) in the above embodiments. Although a top-gate transistor is used as an example in the following description, the structure of the transistor is not limited thereto.

First, an insulating layer 202 is formed over the substrate 200. Then, an oxide semiconductor layer 206 is formed over the insulating layer 202 (see FIG. 12A).

As the substrate 200, for example, a glass substrate can be used. The glass substrate is preferably a non-alkali glass substrate. For the non-alkali glass substrate, a glass material such as aluminosilicate glass, aluminoborosilicate glass, or barium borosilicate glass is used, for example. As the substrate 200, in addition to a glass substrate, an insulating substrate formed using an insulator such as a ceramic substrate, a quartz substrate, or a sapphire substrate, a semiconductor substrate which is formed using a semiconductor material such as silicon and whose surface is covered with an insulating material, or a conductive substrate which is formed using a conductor such as metal or stainless steel and whose surface is covered with an insulating material can be used. A substrate formed from a flexible synthetic resin, such as plastic, generally tends to have a low upper temperature limit, but can be used as the substrate 200 as long as the substrate can withstand the later manufacturing process.

The insulating layer 202 functions as a base and can be formed by a PVD method, a CVD method, or the like. The insulating layer 202 can be formed using a material containing an inorganic insulating material such as silicon oxide, silicon oxynitride, silicon nitride, hafnium oxide, aluminum oxide, or tantalum oxide. Note that it is preferable to form the insulating layer 202 so as to contain hydrogen or water as little as possible.

The oxide semiconductor layer includes at least one element selected from In, Ga, Sn, and Zn. For example, a fourcomponent metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor, a single-component metal oxide such as an In—O-based oxide semiconductor, a Sn—O-based oxide semiconductor, or a Zn—O-based oxide semiconductor, or the like can be used. In addition, any of the above oxide semiconductors may contain an element other than In, Ga, Sn, and Zn, for example, $SiO_2$.

For example, an In—Ga—Zn—O-based oxide semiconductor means an oxide semiconductor containing indium (In), gallium (Ga), and zinc (Zn), and there is no limitation on the composition ratio thereof.

In particular, an In—Ga—Zn—O-based oxide semiconductor material has sufficiently high resistance when there is no electric field and thus off-state current can be sufficiently reduced. In addition, with high field-effect mobility, the In—Ga—Zn—O-based oxide semiconductor material is suitable for a semiconductor device.

As a typical example of the In—Ga—Zn—O-based oxide semiconductor material, one represented by $InGaO_3(ZnO)_m$ (m>0) is given. Further, there is an oxide semiconductor material represented by $InMO_3(ZnO)_m$ (m>0) when M is used instead of Ga. Here, M denotes one or more metal elements selected from gallium (Ga), aluminum (Al), iron (Fe), nickel (Ni), manganese (Mn), cobalt (Co), or the like. For example, M can be Ga, Ga and Al, Ga and Fe, Ga and Ni, Ga and Mn, Ga and Co, or the like. Note that the above-described compositions are derived from the crystal structures that the oxide semiconductor material can have and are only examples.

In the case where an In—Zn—O-based material is used as the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 ($In_2O_3$:ZnO=15:2 to 3:4 in a molar ratio). For example, when a target used for forming the In—Zn—O-based oxide semiconductor has a composition ratio of In:Zn:O=X:Y:Z in an atomic ratio, Z>1.5X+Y.

As a target for forming the oxide semiconductor layer 206 by a sputtering method, a target which can be represented by a compositional formula of In:Ga:Zn=1:x:y (x is 0 or more and y is 0.5 or more and 5 or less) may be used. For example, a target having a composition ratio of $In_2O_3$:$Ga_2O_3$:ZnO=1:1:2 [molar ratio] may be used. Alternatively, a target having a composition ratio of $In_2O_3$:$Ga_2O_3$:ZnO=1:1:1 [molar ratio] (x=1, y=0.5), a target having a composition ratio of $In_2O_3$:$Ga_2O_3$:ZnO=1:1:4 [molar ratio] (x=1, y=2), or a target having a composition ratio of $In_2O_3$:$Ga_2O_3$:ZnO=1:0:2 [molar ratio] (x=0, y=1) can be used.

In this embodiment, the oxide semiconductor layer 206 with an amorphous structure is formed by a sputtering method using an In—Ga—Zn—O-based metal oxide target.

The relative density of the metal oxide in the metal oxide target is 80% or more, preferably 95% or more, and more preferably 99.9% or more. The use of the metal oxide target with high relative density makes it possible to form the oxide semiconductor layer 206 having a dense structure.

The atmosphere in which the oxide semiconductor layer 206 is formed is preferably a rare gas (typically argon) atmosphere, an oxygen atmosphere, or a mixed atmosphere containing a rare gas (typically argon) and oxygen. Specifically, it is preferable to use, for example, a high-purity gas atmosphere from which an impurity such as hydrogen, water, a hydroxyl group, or hydride is removed to 1 ppm or less (preferably, 10 ppb or less).

At the time of forming the oxide semiconductor layer 206, for example, the substrate is held in a treatment chamber that is kept in a reduced-pressure state, and the substrate is heated to a temperature higher than or equal to 100° C. and lower than 550° C., preferably higher than or equal to 200° C. and lower than or equal to 400° C. Then, a sputtering gas from which hydrogen, water, and the like are removed is introduced into the treatment chamber while moisture in the treatment chamber is removed, whereby the oxide semiconductor layer 206 is formed using the aforementioned target. By forming the oxide semiconductor layer 206 while the substrate is heated, impurities contained in the oxide semiconductor layer 206 can be reduced. Moreover, damage due to sputtering can be reduced. In order to remove moisture in the treatment chamber, an entrapment vacuum pump is preferably used. For example, a cryopump, an ion pump, a titanium sublimation pump, or the like can be used. Alternatively, a turbo molecular pump provided with a cold trap may be used. Since hydrogen, water, or the like is removed from the treatment chamber evacuated with a cryopump, the concentration of impurities in the oxide semiconductor layer 206 can be reduced.

The oxide semiconductor layer 206 can be formed, for example, under the following conditions: the distance between the substrate and the target is 170 mm; the pressure is 0.4 Pa; the direct-current (DC) power is 0.5 kW; and the atmosphere is oxygen (the proportion of oxygen is 100%), argon (the proportion of argon is 100%), or a mixed atmosphere containing oxygen and argon. Note that it is preferable to use a pulsed direct-current (DC) power source because dust (such as powder substances formed at the time of deposition) can be reduced and the thickness is uniform. The thickness of the oxide semiconductor layer 206 is greater than or equal to 2 nm and less than or equal to 200 nm, preferably greater than or equal to 5 nm and less than or equal to 30 nm Note that the appropriate thickness of the oxide semiconductor layer differs depending on the oxide semiconductor material to be used, the intended purpose of a semiconductor device, or the like; therefore, the thickness may be determined in accordance with the material, the intended purpose, or the like.

Note that before the oxide semiconductor layer 206 is formed by sputtering, reverse sputtering is preferably performed in which plasma is generated with an argon gas introduced, so that substances attached to the surface of the insulating layer 202 are removed. Here, the reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface to be processed in an argon atmosphere so that plasma is generated near a substrate. Note that an atmosphere of nitrogen, helium, oxygen, or the like may be used instead of an argon atmosphere.

Next, the oxide semiconductor layer 206 is processed by a method such as etching using a mask, whereby an island-shaped oxide semiconductor layer 206a is formed.

As a method for etching the oxide semiconductor layer 206, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape.

An example of an etching gas used for dry etching is a gas containing chlorine (a chlorine-based gas such as chlorine ($Cl_2$), boron trichloride ($BCl_3$), silicon tetrachloride ($SiCl_4$), or carbon tetrachloride ($CCl_4$)). Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As the dry etching method, a parallel plate RIE (reactive ion etching) method or an ICP (inductively coupled plasma) etching method can be used. In order to etch the oxide semiconductor layer into a desired shape, etching conditions (e.g., the amount of electric power applied to a coiled electrode, the amount of electric power applied to an electrode on the substrate side, and the electrode temperature on the substrate side) are set as appropriate.

As an etchant used for wet etching, a mixed solution of phosphoric acid, acetic acid, and nitric acid, or the like can be used. An etchant such as ITO07N (produced by KANTO CHEMICAL CO., INC.) may also be used.

After that, heat treatment (first heat treatment) is preferably performed on the oxide semiconductor layer 206a. Excessive hydrogen (including water and hydroxyl group) in the oxide semiconductor layer 206a is removed by the first heat treatment and a structure of the oxide semiconductor is improved, so that defect levels in the energy gap of the oxide semiconductor layer 206a can be reduced. The temperature of the first heat treatment is, for example, higher than or equal to 300° C. and lower than 550° C., or higher than or equal to 400° C. and lower than or equal to 500° C. Note that in the case where the heat treatment is performed after etching, there is an advantage that time for etching can be shortened even when wet etching is used.

For example, after the substrate 200 is introduced into an electric furnace including a resistance heater or the like, the heat treatment can be performed at 450° C. for 1 hour in a nitrogen atmosphere. The oxide semiconductor layer 206a is not exposed to the air during the heat treatment so that the entry of water or hydrogen can be prevented.

The heat treatment apparatus is not limited to the electric furnace and can be an apparatus for heating an object to be processed by thermal conduction or thermal radiation from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the first heat treatment, GRTA treatment may be performed as follows. The substrate is placed in an inert gas atmosphere which has been heated, heated for several minutes, and taken out of the heated inert gas atmosphere. The GRTA treatment enables high-temperature heat treatment in a short time. Moreover, the GRTA treatment can be employed even when the temperature exceeds the upper temperature limit of the substrate because the heat treatment is performed in a short time. Note that the inert gas may be switched to a gas including oxygen during the treatment. This is because defect levels in the energy gap due to oxygen deficiency can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is less than or equal to 1 ppm, preferably less than or equal to 0.1 ppm).

In any case, when the impurities are reduced through the first heat treatment to form the i-type or substantially i-type oxide semiconductor layer 206a, a transistor with excellent characteristics can be realized.

Note that the first heat treatment can also be performed on the oxide semiconductor layer 206 that has not yet been processed into the island-shaped oxide semiconductor layer 206a. In that case, after the first heat treatment, the substrate 200 is taken out of the heating apparatus and a photolithography step is performed.

The first heat treatment has an effect of removing hydrogen, water, and the like and can be referred to as dehydration treatment, dehydrogenation treatment, or the like. The dehydration treatment or dehydrogenation treatment can be performed, for example, after the oxide semiconductor layer is formed, or after a source or drain electrode is stacked over the oxide semiconductor layer 206a. Such dehydration treatment or dehydrogenation treatment may be performed once or plural times.

Next, a conductive layer is formed to be in contact with the oxide semiconductor layer 206a. Then, the conductive layer is selectively etched to form a source or drain electrode 208a and a source or drain electrode 208b (see FIG. 12B).

The conductive layer can be formed by a PVD method such as a sputtering method or a CVD method such as a plasma CVD method. As a material for the conductive layer, an element selected from aluminum, chromium, copper, tantalum, titanium, molybdenum, or tungsten; an alloy containing any of these elements as a component; or the like can be used. Alternatively, one or more materials selected from manganese, magnesium, zirconium, beryllium, and thorium may be used. Aluminum combined with one or more of elements selected from titanium, tantalum, tungsten, molybdenum, chromium, neodymium, or scandium may be used. The conductive layer can have a single-layer structure or a stacked structure including two or more layers. For example, the conductive layer can have a single-layer structure of an aluminum film containing silicon, a two-layer structure in which a titanium film is stacked over an aluminum film, or a three-layer structure in which a titanium film, an aluminum film, and a titanium film are stacked in this order.

Alternatively, the conductive layer may be formed using conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

Figure 12A:
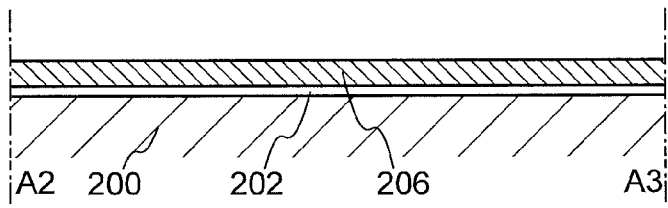
FIGS. 12A to 12E are cross-sectional views illustrating manufacturing steps of a semiconductor device.
Figure 12B:
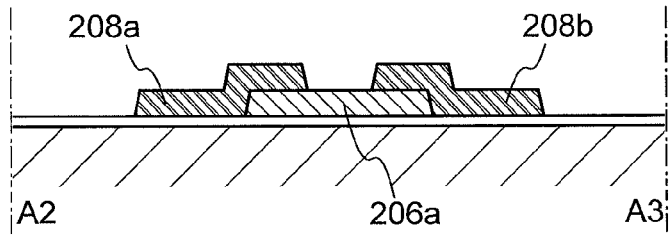
Figure 12C:
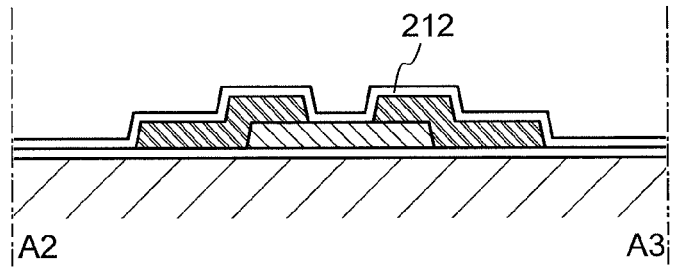

Next, a gate insulating layer 212 which is in contact with part of the oxide semiconductor layer 206a is formed (see FIG. 12C). The gate insulating layer 212 can be formed by a CVD method such as a plasma CVD method, a sputtering method, or the like. The gate insulating layer 212 preferably contains silicon oxide, silicon nitride, silicon oxynitride, aluminum oxide, hafnium oxide, tantalum oxide, gallium oxide, or the like. The gate insulating layer 212 may have a single-layer structure or a stacked-layer structure. There is no particular limitation on the thicknesses of the gate insulating layer 212, and for example, it can be greater than or equal to 10 nm and less than or equal to 500 nm.

After the gate insulating layer 212 is formed, second heat treatment is preferably performed under an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for 1 hour in a nitrogen atmosphere. The second heat treatment can reduce variation in electric characteristics of the transistor. In the case where the gate insulating layer 212 contains oxygen, it is possible to supply oxygen to the oxide semiconductor layer 206a and compensate for oxygen deficiency in the oxide semiconductor layer 206a so that an oxide semiconductor layer which is an i-type oxide semiconductor layer (an intrinsic semiconductor layer) or a substantially i-type semiconductor layer can be formed.

Note that although the second heat treatment is performed in this embodiment after the gate insulating layer 212 is formed, the timing of the second heat treatment is not limited thereto.

Figure 12D:
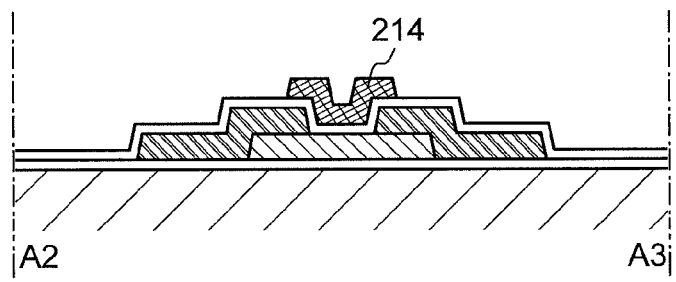

Next, a gate electrode 214 is formed over the gate insulating layer 212 in a region overlapping with the oxide semiconductor layer 206a (see FIG. 12D). The gate electrode 214 can be formed by forming a conductive layer over the gate insulating layer 212 and then patterning the conductive layer. The conductive layer to be the gate electrode 214 can be formed by a PVD method such as a sputtering method or a CVD method such as a plasma CVD method. The description of the source or drain electrode 208a can be referred to for the details.

Figure 12E:
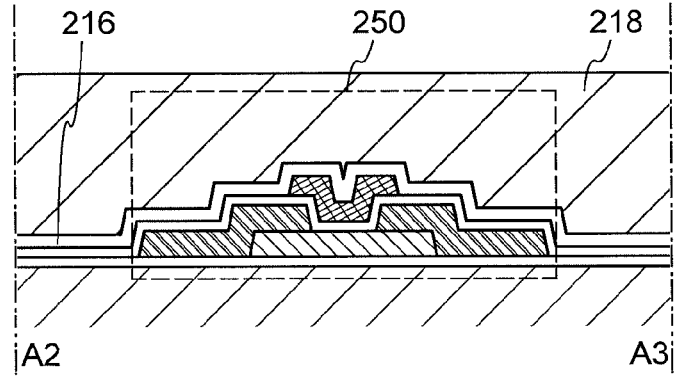

Next, an interlayer insulating layer 216 and an interlayer insulating layer 218 are formed over the gate insulating layer 212 and the gate electrode 214 (see FIG. 12E). The interlayer insulating layer 216 and the interlayer insulating layer 218 can be formed by a PVD method, a CVD method, or the like. The interlayer insulating layer 216 and the interlayer insulating layer 218 can be formed using a material including an inorganic insulating material such as silicon oxide, silicon oxynitride, silicon nitride, hafnium oxide, aluminum oxide, or tantalum oxide. Note that although a stacked structure of the interlayer insulating layer 216 and the interlayer insulating layer 218 is used in this embodiment, an embodiment of the disclosed invention is not limited thereto. A single-layer structure or a stacked structure including three or more layers can also be used.

Note that the interlayer insulating layer 218 is preferably formed so as to have a planarized surface. This is because an electrode, a wiring, or the like can be favorably formed over the interlayer insulating layer 218 when the interlayer insulating layer 218 is formed so as to have a planarized surface.

Through the above steps, a transistor 250 including the highly-purified oxide semiconductor layer 206a is completed (see FIG. 12E).

The transistor 250 illustrated in FIG. 12E includes the following: the oxide semiconductor layer 206a provided over the substrate 200 with the insulating layer 202 interposed therebetween; the source or drain electrode 208a and the source or drain electrode 208b electrically connected to the oxide semiconductor layer 206a; the gate insulating layer 212 covering the oxide semiconductor layer 206a, the source or drain electrode 208a, and the source or drain electrode 208b; the gate electrode 214 over the gate insulating layer 212; the interlayer insulating layer 216 over the gate insulating layer 212 and the gate electrode 214; and the interlayer insulating layer 218 over the interlayer insulating layer 216.

In the transistor 250 shown in this embodiment, the oxide semiconductor layer 206a is highly purified. Therefore, the concentration of hydrogen in the oxide semiconductor layer 206a is $5 \times 10^{19}$ atoms/cm$^3$ or less, preferably $5 \times 10^{18}$ atoms/cm$^3$ or less, and more preferably $5 \times 10^{17}$ atoms/cm$^3$ or less. In addition, the carrier density of the oxide semiconductor layer 206a is sufficiently low (e.g., less than $1 \times 10^{12}$ atoms/cm$^3$, preferably less than $1.45 \times 10^{10}$ atoms/cm$^3$) as compared to that of a typical silicon wafer (approximately $1 \times 10^{14}$ atoms/cm$^3$). As a result of this, a sufficiently low off-state current can be obtained. For example, in the case where a channel length is 10 μm and the thickness of the oxide semiconductor layer is 30 nm, when a drain voltage ranges from approximately 1 V to 10 V, off-state current (a drain current when a gate-source voltage is lower than or equal to 0 V) is smaller than or equal to $1 \times 10^{-13}$ A. Then, the off current density (a value obtained by dividing the off-state current by the channel width of the transistor) of the transistor 250 at room temperature, which is approximately $1 \times 10^{-23}$ A/μm (10 yA/μm) to $1 \times 10^{-22}$ A/μm (100 yA/μm), can be obtained by the current measurement method described in the above embodiments.

Note that the characteristics of the transistor can be represented using off resistance (resistance value when the transistor is in an off state) or off resistivity (resistivity when the transistor is in an off state) besides off-state current or off current density. Here, off resistance R can be obtained by Ohm's law using off-state current and drain voltage. Further, off resistivity ρ can be obtained by formula ρ=RA/L using a cross sectional area A of a channel formation region and a channel length L. Specifically, in the above case, off resistivity is $1 \times 10^9$ am or more (alternatively, $1 \times 10^{10}$ Ω·m or more). Note that the cross sectional area A is represented by A=dW using the thickness d of an oxide semiconductor layer and a channel width W.

In this manner, by using the highly-purified and intrinsic oxide semiconductor layer 206a, the off-state current of the transistor can be sufficiently reduced.

The transistor 250 manufactured in this embodiment has the highly-purified oxide semiconductor layer 206a, and thus provides an off-state current of $1 \times 10^{-13}$ A or smaller. In such a case, it is difficult to precisely measure the value of the off-state current of a transistor such as that manufactured in this embodiment, with a conventional technique for measuring off-state current whose lowest detection limit is approximately 10 fA.

In the current measurement method described in the above-mentioned embodiments, current is not directly measured; instead, current is measured by measuring a change in potential through time, thereby allowing minute current to be measured. This enables the measurement of a current of 10 fA or smaller, which has been difficult to achieve, for example, the measurement of a current value of even 1 zA or smaller. By using the above current measurement method as an inspection method and employing it in the manufacturing process of a transistor, an inspection is conducted to determine whether or not the transistor has predetermined characteristics, and defects in the transistor can be detected accurately. Further, a semiconductor device having preferred characteristics can be manufactured by determining the parameters of the transistor on the basis of current values obtained by the current measurement method described in the above embodiments.

The structures, methods, and the like described in this embodiment can be combined with any of the structures, methods, and the like described in the other embodiments as appropriate.

(Embodiment 8)

In this embodiment, a manufacturing method of a semiconductor device including an oxide semiconductor will be described with reference to FIGS. 13A to 13E. In this embodiment, description is made in detail in the case where, as an oxide semiconductor layer, a first oxide semiconductor layer having a crystallized region and a second oxide semiconductor layer that is obtained by crystal growth from the crystallized region of the first oxide semiconductor layer are used. A semiconductor device in this embodiment can be used as the electrical element 101 (e.g., the transistor 104) in the above embodiments. Although a top-gate transistor is used as an example in the following description, the structure of the transistor is not limited thereto.

First, an insulating layer 302 is formed over a substrate 300. Next, a first oxide semiconductor layer is formed over the insulating layer 302, and then subjected to first heat treatment so that a region including at least a surface of the first oxide semiconductor layer is crystallized, whereby a first oxide semiconductor layer 304 is formed (see FIG. 13A).

As the substrate 300, a substrate similar to the substrate 200 in the above embodiment can be used. The above embodiment may be referred to for details.

The insulating layer 302 serves as a base, and can be formed in a manner similar to that of the insulating layer 202 in the above embodiment. The above embodiment may be referred to for details. Note that it is preferable to form the insulating layer 302 so as to contain hydrogen or water as little as possible.

The first oxide semiconductor layer can be formed in a manner similar to that of the oxide semiconductor layer 206 in the above embodiment. The above embodiment can be referred to for the details of the first oxide semiconductor layer and the deposition method thereof. Note that in this embodiment, the first oxide semiconductor layer is preferably formed using an oxide semiconductor which is easily crystallized, in order to crystallize the first oxide semiconductor layer intentionally by the first heat treatment. As such an oxide semiconductor, for example, ZnO is given. Further, it is also preferable to use an In—Ga—Zn—O-based oxide semiconductor in which the proportion of Zn in metal elements (In, Ga, Zn) is 60% or more, because an In—Ga—Zn—O-based oxide semiconductor containing Zn at high concentration is easily crystallized. The thickness of the first oxide semiconductor layer is preferably grater than or equal to 3 nm and less than or equal to 15 nm. In this embodiment, the first oxide semiconductor layer has a thickness of 5 nm as an example. Note that the appropriate thickness of the oxide semiconductor layer differs depending on the oxide semiconductor material to be used, the intended purpose of a semiconductor device, or the like; therefore, the thickness may be determined in accordance with the material to be used, the intended purpose, or the like.

The first heat treatment is performed at a temperature higher than or equal to 550° C. and lower than or equal to 850° C., preferably higher than or equal to 600° C. and lower than or equal to 750° C. It is desirable that the heat treatment be performed for longer than or equal to 1 minute and shorter than or equal to 24 hours. Note that the temperature and time of the heat treatment differ depending on the kind of the oxide semiconductor or the like. In addition, the atmosphere of the first heat treatment is preferably an atmosphere which does not contain hydrogen, water, or the like. For example, an atmosphere of nitrogen, oxygen, or a rare gas (e.g., helium, neon, or argon), from which water is sufficiently removed, can be used.

As the heat treatment apparatus, in addition to the electric furnace, an apparatus for heating an object to be processed by thermal conduction or thermal radiation from a medium such as a heated gas can be used. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp A GRTA apparatus is an apparatus for performing heat treatment using a high-temperature gas. As the gas, an inert gas which does not react with an object to be processed by heat treatment, such as nitrogen or a rare gas such as argon, is used.

Through the aforementioned first heat treatment, a region including at least the surface of the first oxide semiconductor layer is crystallized. The crystallized region is formed in such a manner that crystal growth proceeds from the surface of the first oxide semiconductor layer toward the inside of the first oxide semiconductor layer. Note that in some cases, the crystallized region includes a plate-like crystal with an average thickness of greater than or equal to 2 nm and less than or equal to 10 nm. Further, the crystallized region includes crystals which are c-axis-aligned in a direction substantially perpendicular to the surface of the oxide semiconductor layer in some cases. Here, "substantial perpendicular" means a state within ±10° from a perpendicular direction.

Through the first heat treatment during which the crystallized region is formed, hydrogen (including water or hydroxyl groups) in the first oxide semiconductor layer is preferably removed. In the case where hydrogen or the like is removed, the first heat treatment is preferably performed in a nitrogen atmosphere, an oxygen atmosphere, or a rare gas (helium, neon, argon, or the like) atmosphere whose purity is 6N (99.9999%) or higher (that is, the impurity concentration is 1 ppm or lower). More preferably, an atmosphere with a purity of 7N (99.99999%) or higher (that is, the impurity concentration is 0.1 ppm or lower) may be used. Alternatively, the first heat treatment may be performed in ultra-dry air containing $H_2O$ with 20 ppm or lower, preferably 1 ppm or lower.

Furthermore, through the first heat treatment during which the crystallized region is formed, oxygen is preferably supplied to the first oxide semiconductor layer. Oxygen can be supplied to the first oxide semiconductor layer by, for example, changing the atmosphere for the heat treatment to an oxygen atmosphere.

The first heat treatment in this embodiment is as follows: hydrogen or the like is removed from the oxide semiconductor layer through heat treatment under a nitrogen atmosphere at 700° C. for 1 hour, and then the atmosphere is changed to an oxygen atmosphere so that oxygen is supplied to the inside of the first oxide semiconductor layer. Note that the main purpose of the first heat treatment is to form the crystallized region; accordingly, treatment for removing hydrogen or the like and treatment for supplying oxygen may be performed separately. For example, heat treatment for crystallization can be performed after heat treatment for removing hydrogen or the like and treatment for supplying oxygen are performed.

By such first heat treatment, the first oxide semiconductor layer which includes the crystallized region, from which hydrogen (including water and a hydroxyl group) or the like is removed and to which oxygen is supplied can be obtained.

Figure 13A:
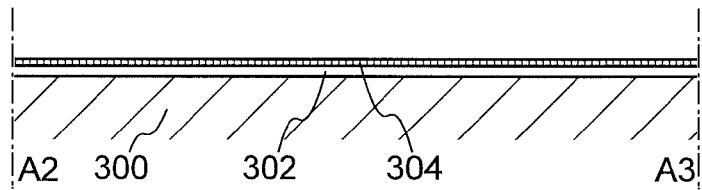
FIGS. 13A to 13E are cross-sectional views illustrating manufacturing steps of a semiconductor device.
Figure 13B:
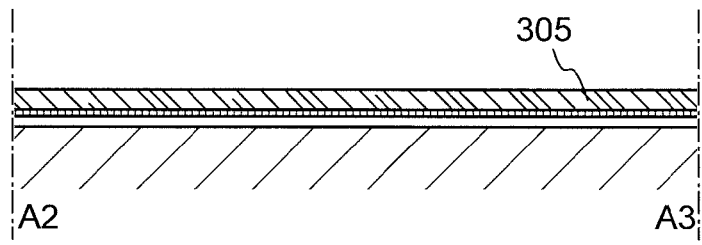

Next, a second oxide semiconductor layer 305 is formed over the first oxide semiconductor layer 304 including the crystallized region in the region including at least the surface (see FIG. 13B).

The second oxide semiconductor layer 305 can be formed in a manner similar to that of the oxide semiconductor layer 206 shown in the above embodiment. The above embodiment may be referred to for the details of the second oxide semiconductor layer 305 and the deposition method thereof. Note that the second oxide semiconductor layer 305 is preferably formed to be thicker than the first oxide semiconductor layer 304. Further, the second oxide semiconductor layer 305 is preferably formed so that the total thickness of the first oxide semiconductor layer 304 and the second oxide semiconductor layer 305 is greater than or equal to 3 nm and less than or equal to 50 nm. Note that the appropriate thickness of the oxide semiconductor layer differs depending on the oxide semiconductor material to be used, the intended purpose of a semiconductor device, or the like; therefore, the thickness may be determined in accordance with the material, the intended purpose, or the like.

The second oxide semiconductor layer 305 and the first oxide semiconductor layer 304 are preferably formed using materials which have the same main component and have close lattice constants after crystallization (lattice mismatch is 1% or less). This is because in the crystallization of the second oxide semiconductor layer 305, crystal growth easily proceeds from the crystallized region of the first oxide semiconductor layer 304 as a seed in the case where materials having the same main component and close lattice constants are used. In addition, the use of materials having the same main component realizes favorable interface physical properties or electric characteristics.

Note that when desired film quality can be obtained by the crystallization, the second oxide semiconductor layer 305 may be formed using a material containing a different main component.

Next, second heat treatment is performed on the second oxide semiconductor layer 305 so that crystal growth using the crystallized region of the first oxide semiconductor layer 304 as a seed proceeds. Thus, a second oxide semiconductor layer 306 is formed (see FIG. 13C).

The temperature of the second heat treatment is set to higher than or equal to 550° C. and lower than or equal to 850° C., preferably higher than or equal to 600° C. and lower than or equal to 750° C. The time for the second heat treatment is longer than or equal to 1 minute and shorter than or equal to 100 hours, preferably longer than or equal to 5 hours and shorter than or equal to 20 hours, and typically 10 hours. Note that the second heat treatment is also preferably performed under an atmosphere that does not contain hydrogen, water, or the like.

The details of the atmosphere and effects of the heat treatment are similar to those of the first heat treatment. The heat treatment apparatus that can be used is also similar to that of the first heat treatment. For example, in the second heat treatment, a furnace is filled with a nitrogen atmosphere when a temperature rises, and the furnace is filled with an oxygen atmosphere when the temperature falls, whereby hydrogen or the like can be removed under the nitrogen atmosphere and oxygen can be supplied under the oxygen atmosphere.

Through the aforementioned second heat treatment, crystal growth can proceed from the crystallized region of the first oxide semiconductor layer 304 to the whole of the second oxide semiconductor layer 305, so that the second oxide semiconductor layer 306 can be formed. In addition, it is possible to form the second oxide semiconductor layer 306 from which hydrogen (including water and hydroxyl groups) or the like is removed and to which oxygen is supplied. Furthermore, the orientation of the crystallized region of the first oxide semiconductor layer 304 can be improved through the second heat treatment.

For example, in the case where an In—Ga—Zn—O-based oxide semiconductor material is used for the second oxide semiconductor layer 306, the second oxide semiconductor layer 306 can include a crystal represented by $InGaO_3(ZnO)_m$ (m is a natural number), a crystal represented by $In_2Ga_2ZnO_7$ (In:Ga:Zn:O=2:2:1:7 [atomic ratio]), or the like. Such crystals are aligned through the second heat treatment so that the c-axis may be in a direction substantially perpendicular to the surface of the second oxide semiconductor layer 306a.

Here, the above-described crystal has a structure in which a layer containing In and a layer not containing In (a layer containing Ga or Zn) are stacked in the c-axis direction.

In an In—Ga—Zn—O-based oxide semiconductor crystal, the conductivity of the layer containing In in a direction parallel to an in-plane direction is favorable. This is because the fact that electric conductivity is mainly controlled by In in the In—Ga—Zn—O-based oxide semiconductor crystal and the fact that the 5s orbital of one In atom overlaps with the 5s orbital of an adjacent In atom and a carrier path is formed.

Further, in the case where the first oxide semiconductor layer 304 includes an amorphous region at the interface with the insulating layer 302, through the second heat treatment, crystal growth proceeds in some cases from the crystallized region formed on the surface of the first oxide semiconductor layer 304 toward the bottom of the first oxide semiconductor layer to crystallize the amorphous region. Note that in some cases, the amorphous region remains depending on the material of the insulating layer 302, the heat treatment conditions, and the like.

Figure 13C:
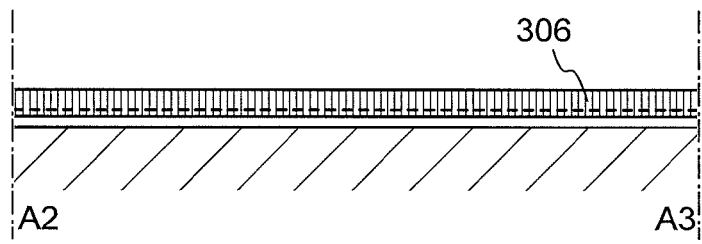

In the case where the first oxide semiconductor layer 304 and the second oxide semiconductor layer 305 are formed using oxide semiconductor materials having the same main component, in some cases, the first oxide semiconductor layer 304 and the second oxide semiconductor layer 306 have the same crystal structure, as illustrated in FIG. 13C. Therefore, although indicated by a dotted line in FIG. 13C, the boundary between the first oxide semiconductor layer 304 and the second oxide semiconductor layer 306 might not be distinguished, so that the first oxide semiconductor layer 304 and the second oxide semiconductor layer 306 might be regarded as one layer.

Figure 13D:
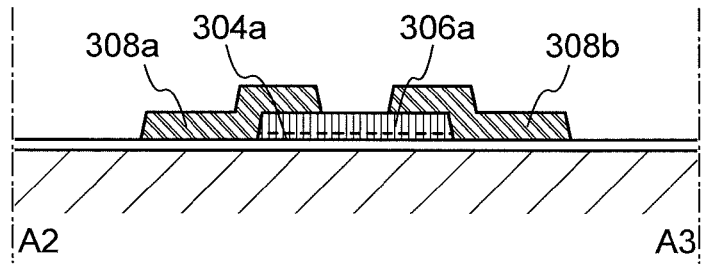

Next, the first oxide semiconductor layer 304 and the second oxide semiconductor layer 306 are processed with a method such as etching using a mask, whereby an island-shaped first oxide semiconductor layer 304a and an island-shaped second oxide semiconductor layer 306a are formed (see FIG. 13D). Note that here, processing for forming the island-shaped oxide semiconductor is performed after the second heat treatment; however, the second heat treatment may be performed after the processing for forming the island-shaped oxide semiconductor layer. In this case, there is the advantage that the time for etching is shortened even when wet etching is used.

As an etching method for the first oxide semiconductor layer 304 and the second oxide semiconductor layer 306, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape. The first oxide semiconductor layer 304 and the second oxide semiconductor layer 306 can be etched in a manner similar to that of the oxide semiconductor layer shown in the above embodiment. The aforementioned embodiment may be referred to for details.

A region of the oxide semiconductor layers, which becomes a channel formation region, preferably has a planarized surface. For example, the surface of the second oxide semiconductor layer 306 preferably has a peak-to-valley height of 1 nm or less (more preferably 0.2 nm or less) in a region overlapping with a gate electrode (the channel formation region).

Next, a conductive layer is formed to be in contact with the second oxide semiconductor layer 306a. The conductive layer is selectively etched, so that a source or drain electrode 308a and a source or drain electrode 308b are formed (see FIG. 13D). The source or drain electrode 308a and the source or drain electrode 308b can be formed in a manner similar to that of the source or drain electrode 208a and the source or drain electrode 208b described in the above embodiment. The aforementioned embodiment may be referred to for details.

In the step illustrated in FIG. 13D, crystal layers on the side surfaces of the first oxide semiconductor layer 304a and the second oxide semiconductor layer 306a, which are in contact with the source or drain electrode 308a and the source or drain electrode 308b, are amorphous in some cases. Therefore, the entire region of the first oxide semiconductor layer 304a and the second oxide semiconductor layer 306a does not always have a crystal structure.

Next, a gate insulating layer 312 in contact with part of the second oxide semiconductor layer 306a is formed. The gate insulating layer 312 can be formed by a sputtering method, a CVD method such as a plasma CVD method, or the like. Then, a gate electrode 314 is formed over the gate insulating layer 312 in a region overlapping with the first oxide semiconductor layer 304a and the second oxide semiconductor layer 306a. After that, an interlayer insulating layer 316 and an interlayer insulating layer 318 are formed over the gate insulating layer 312 and the gate electrode 314 (see FIG. 13E). The gate insulating layer 312, the gate electrode 314, the interlayer insulating layer 316, and the interlayer insulating layer 318 can be formed in a manner similar to that of the gate insulating layer 212, the gate electrode 214, the interlayer insulating layer 216, and the interlayer insulating layer 218, respectively, described in the above embodiment. The aforementioned embodiment may be referred to for details.

After the gate insulating layer 312 is formed, third heat treatment is preferably performed under an inert gas atmosphere or an oxygen atmosphere. The third heat treatment is performed at a temperature of higher than or equal to 200° C. and lower than or equal to 450° C., preferably higher than or equal to 250° C. and lower than or equal to 350° C. For example, the heat treatment may be performed at 250° C. for 1 hour in an atmosphere containing oxygen. The third heat treatment can reduce variation in electric characteristics of the transistor. In the case where the gate insulating layer 312 is an insulating layer containing oxygen, by supplying oxygen to the second oxide semiconductor layer 306a to fill oxygen deficiency of the second oxide semiconductor layer 306a, an i-type (intrinsic) or substantially i-type oxide semiconductor layer can also be formed.

Note that although the third heat treatment is performed in this embodiment after the gate insulating layer 312 is formed, the timing of the third heat treatment is not limited thereto. Further, the third heat treatment may be omitted in the case where oxygen is supplied to the second oxide semiconductor layer through other treatment such as the second heat treatment.

Through the above steps, a transistor 350 is completed. The transistor 350 includes the first oxide semiconductor layer 304a and the second oxide semiconductor layer 306a which is obtained by crystal growth from the crystallized region of the first oxide semiconductor layer 304a (see FIG. 13E).

Figure 13E:
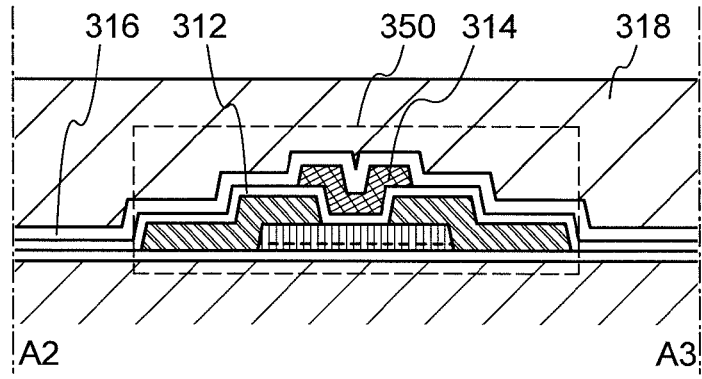

The transistor 350 illustrated in FIG. 13E includes: the first oxide semiconductor layer 304a provided over the substrate 300 with the insulating layer 302 interposed therebetween; the second oxide semiconductor layer 306a provided over the first oxide semiconductor layer 304a; the source or drain electrode 308a and the source or drain electrode 308b that are electrically connected to the second oxide semiconductor layer 306a; the gate insulating layer 312 covering the second oxide semiconductor layer 306a, the source or drain electrode 308a, and the source or drain electrode 308b; the gate electrode 314 over the gate insulating layer 312; the interlayer insulating layer 316 over the gate insulating layer 312 and the gate electrode 314; and the interlayer insulating layer 318 over the interlayer insulating layer 316.

In the transistor 350 shown in this embodiment, the first oxide semiconductor layer 304a and the second oxide semiconductor layer 306a are highly purified. Therefore, the concentration of hydrogen in the first oxide semiconductor layer 304a and the second oxide semiconductor layer 306a is $5\times10^{19}$ atoms/cm$^3$ or less, preferably $5\times10^{18}$ atoms/cm$^3$ or less, and more preferably $5\times10^{17}$ atoms/cm$^3$ or less. In addition, the carrier density of the oxide semiconductor layer 206a is sufficiently low (e.g., less than $1\times10^{12}$ atoms/cm$^3$, preferably less than $1.45\times10^{10}$ atoms/cm$^3$) as compared to that of a typical silicon wafer (approximately $1\times10^{14}$ atoms/cm$^3$). As a result of this, a sufficiently low off-state current can be obtained. For example, in the case where a channel length is 10 μm and the thickness of the oxide semiconductor layer is 30 nm, when a drain voltage ranges from approximately 1 V to 10 V, off-state current (a drain current when a gate-source voltage is lower than or equal to 0 V) is smaller than or equal to $1\times10^{-13}$ A. Then, the off current density (a value obtained by dividing the off-state current by the channel width of the transistor) of the transistor 350 at room temperature, which is approximately $1\times10^{-23}$ A/μm (10 yA/μm) to $1\times10^{-22}$ A/μm (100 yA/μm), can be obtained by the current measurement method described in the above embodiments.

Note that the characteristics of the transistor can be represented using off resistance (resistance value when the transistor is in an off state) or off resistivity (resistivity when the transistor is in an off state) besides off-state current or off current density. Here, off resistance R can be obtained by Ohm's law using off-state current and drain voltage. Further, off resistivity ρ can be obtained by formula ρ=RA/L using a cross sectional area A of a channel formation region and a channel length L. Specifically, in the above case, off resistivity is $1\times10^9$ Ω·m or more (alternatively, $1\times10^{10}$ Ω·m or more). Note that the cross sectional area A is represented by A=dW using the thickness d of an oxide semiconductor layer and a channel width W.

In this manner, by using the highly-purified and intrinsic first oxide semiconductor layer 304a and second oxide semiconductor layer 306a, the off-state current of the transistor can be sufficiently reduced.

Furthermore, in this embodiment, the first oxide semiconductor layer 304a having a crystallized region and the second oxide semiconductor layer 306a which is obtained by crystal growth from the crystallized region of the first oxide semiconductor layer 304a are used as the oxide semiconductor layer. Thus, the field-effect mobility can be increased and a transistor with favorable electric characteristics can be realized.

The transistor 350 manufactured in this embodiment has the highly-purified oxide semiconductor layers 304a and 306a, and thus provides an off-state current of $1\times10^{-13}$ A or smaller. In such a case, it is difficult to precisely measure the value of the off-state current of a transistor such as that manufactured in this embodiment, with a conventional technique for measuring off-state current whose lowest detection limit is approximately 10 fA.

In the current measurement method described in this embodiment, current is not directly measured; instead, current is measured by measuring a change in potential through time, thereby allowing minute current to be measured. This enables the measurement of a current of 10 fA or smaller, which has been difficult to achieve, for example, the measurement of current density of even 1 $zA/\mu m$ or smaller. By using the above current measurement method as an inspection method and employing it in the manufacturing process of a transistor, an inspection is conducted to determine whether or not the transistor has predetermined characteristics, and defects in the transistor can be detected accurately. Further, a semiconductor device having preferred characteristics can be manufactured by determining the parameters of the transistor on the basis of current values obtained by the current measurement method described in the above embodiments.

The structures, methods, and the like described in this embodiment can be combined with any of the structures, methods, and the like described in the other embodiments as appropriate.

(Embodiment 9)

Figure 14A:
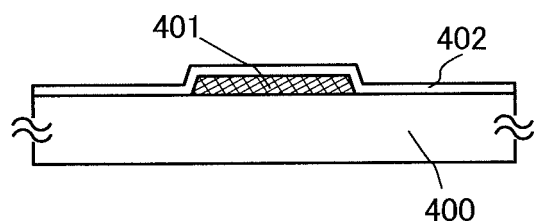
FIGS. 14A to 14C are cross-sectional views illustrating manufacturing steps of a semiconductor device.

In this embodiment, a method for manufacturing a semiconductor device including an oxide semiconductor will be described with reference to FIGS. 14A to 14C. A semiconductor device in this embodiment can be used as the electrical element 101 (e.g., the transistor 104) in the above embodiments. Although a bottom-gate transistor is used as an example in the following description, the structure of the transistor is not limited thereto.

First, a conductive layer is formed over a substrate 400 having an insulating surface, and then, a gate electrode 401 is formed in a first photolithography process. After that, a gate insulating layer 402 is formed so as to cover the gate electrode 401 (see FIG. 14A).

As the substrate 400, a substrate similar to the substrate 200 or the like in the above embodiments can be used. The aforementioned embodiment may be referred to for details.

The gate electrode 401 and the gate insulating layer 402 can be formed using materials and methods similar to those of the gate electrode 214 and the gate insulating layer 212, or the like in the above embodiment. The above embodiment may be referred to for details.

An insulating film serving as a base film may be provided between the substrate 400 and the gate electrode 401. The base film has a function of preventing diffusion of an impurity element from the substrate 400, and can be formed with a single-layer structure or a stacked structure using one or more of a silicon nitride film, a silicon oxide film, a silicon nitride oxide film, and a silicon oxynitride film.

Next, an oxide semiconductor layer having a thickness of greater than or equal to 3 nm and less than or equal to 30 nm is formed over the gate insulating layer 402 by a sputtering method, for example. Note that the gate insulating layer 402 and the oxide semiconductor layer are preferably formed successively without exposure to air. The oxide semiconductor layer can be formed using a material and a method similar to those of the oxide semiconductor layer 206 or the like. The above embodiment may be referred to for details.

Note that before the oxide semiconductor layer is formed by a sputtering method, powder substances (also referred to as particles or dust) which are attached on a surface of the gate insulating layer 402 are preferably removed by reverse sputtering in which an argon gas is introduced and plasma is generated. The reverse sputtering refers to a method in which voltage is applied to a substrate to generate plasma in the vicinity of the substrate to modify a surface. Note that instead of argon, a gas such as nitrogen, helium, or oxygen may be used.

After that, heat treatment (first heat treatment) is preferably performed on the oxide semiconductor layer. Excessive hydrogen (including water and hydroxyl groups) in the oxide semiconductor layer is removed by the first heat treatment and a structure of the oxide semiconductor layer is improved, so that a defect levels in the energy gap can be reduced. The first heat treatment is performed at a temperature of higher than or equal to 250° C. and lower than or equal to 700° C., preferably higher than or equal to 450° C. and lower than or equal to 600° C. or lower than a strain point of the substrate.

Figure 14B:
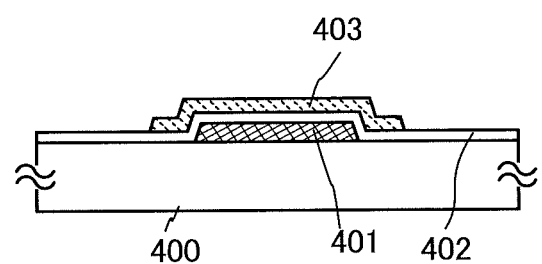

Next, an oxide semiconductor layer 403 is processed into the island-shaped oxide semiconductor layer 403 in a second photolithography process (see FIG. 14B). Further, a resist mask for forming the island-shaped oxide semiconductor layer 403 may be formed by an inkjet method. Formation of the resist mask by an inkjet method needs no photomask; thus, manufacturing cost can be reduced. Note that the oxide semiconductor layer 403 can be subjected to the first heat treatment after patterning of the oxide semiconductor layer 403. The oxide semiconductor layer 403 is not necessarily patterned.

Next, after a conductive layer is formed so as to cover the oxide semiconductor layer 403, a source or drain electrode 405a and a source or drain electrode 405b are formed in a third photolithography process. After that, an insulating film 409 is formed so as to cover the oxide semiconductor layer 403, the source or drain electrode 405a, and the source or drain electrode 405b (see FIG. 14C).

The source or drain electrodes 405a and 405b and the insulating film 409 can be formed using materials and methods similar to those of the source or drain electrodes 208a and 208b and the interlayer insulating layer 216, respectively, or the like in the above embodiment. The above embodiment may be referred to for details.

Next, the oxide semiconductor layer 403 is preferably subjected to second heat treatment while being in contact with the insulating film 409. The second heat treatment is performed at a temperature of higher than or equal to 250° C. and lower than or equal to 700° C., preferably higher than or equal to 450° C. and lower than or equal to 600° C. or lower than a strain point of the substrate.

The second heat treatment may be performed under an atmosphere of nitrogen, oxygen, ultra-dry air (air in which a water content is 20 ppm or lower, preferably 1 ppm or lower, more preferably 10 ppb or lower), or a rare gas (argon, helium, or the like). Note that it is preferable that water, hydrogen, or the like be not contained in the atmosphere of nitrogen, oxygen, ultra-dry air, or a rare gas. It is also preferable that the purity of nitrogen, oxygen, or the rare gas which is introduced into a heat treatment apparatus be set to be 6N (99.9999%) or higher, preferably 7N (99.99999%) or higher (that is, the impurity concentration is 1 ppm or lower, preferably 0.1 ppm or lower).

The second heat treatment is performed while the oxide semiconductor layer 403 and the insulating film 409 are in contact with each other. Accordingly, oxygen which is one of main components of an oxide semiconductor and might be reduced in the above dehydration (or dehydrogenation) treatment can be supplied to the oxide semiconductor layer 403 from the insulating film 409 containing oxygen. Through the above steps, the highly-purified oxide semiconductor layer 403 which is electrically i-type (intrinsic) can be formed.

Figure 14C:
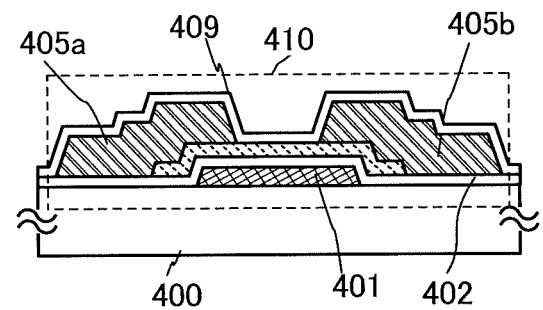

Through the above steps, a transistor 410 is formed (see FIG. 14C). The transistor 410 is a transistor including the oxide semiconductor layer 403 which is highly purified and from which impurities such as hydrogen, moisture, a hydroxyl group, or hydride (also referred to as a hydrogen compound) are intentionally removed. Therefore, variation in the electric characteristics of the transistor 410 is suppressed and the transistor 410 is electrically stable.

Although the second heat treatment is performed in this embodiment after the insulating film 409 is formed, the timing of the second heat treatment is not particularly limited thereto as long as it is performed after the insulating film 409 is formed.

As described above, at least one of the first heat treatment and the second heat treatment is performed, so that the oxide semiconductor layer 403 can be highly purified so as to contain impurities which are not main components as little as possible. In addition, the highly-purified oxide semiconductor layer 403 includes extremely few (close to zero) carriers derived from a donor, and the carrier density thereof is lower than $1\times10^{14}/cm^3$, preferably lower than $1\times10^{12}/cm^3$, more preferably lower than $1\times10^{11}/cm^3$.

As described above, a semiconductor device including an oxide semiconductor which has stable electric characteristics can be provided. Therefore, a semiconductor device with high reliability can be provided.

Note that after formation of the insulating film 409, a conductive layer can be further provided over the insulating film 409 (not illustrated). The conductive layer can be formed using a material and a method similar to those of the gate electrode 401. The conductive layer is provided so as to overlap with the channel formation region in the oxide semiconductor layer 403, whereby in a bias-temperature stress test (referred to as a BT test) for examining the reliability of the transistor 410, the amount of change in the threshold voltage of the transistor 410 before and after the BT test can be further reduced. The conductive layer may have the same potential as the gate electrode 401 or have a potential different from that of the gate electrode 401, and can function as a second gate electrode. The potential of the conductive layer may be GND, 0V, or in a floating state.

Although not illustrated, a protective insulating film may be further formed so as to cover the transistor 410. As the protective insulating film, a silicon nitride film, a silicon nitride oxide film, an aluminum nitride film, or the like can be used.

In this embodiment, a structure is employed in which a region where a gate electrode overlap with a source electrode and a drain electrode (referred to as an overlap region) is provided in the transistor 410; however, one embodiment of the present invention is not limited thereto and a structure may be employed in which a region where a gate electrode does not overlap with either a source electrode or a drain electrode (referred to as an offset region) is provided. When the offset region is provided, the parasitic capacitance of the transistor can be reduced and measurement accuracy can be improved. Further, leakage current through the overlap region can be reduced. The width of the offset region is preferably 0 μm to 3 μm. For example, the parasitic capacitance between the source electrode and the drain electrode is approximately 200 aF/μm in the case where an offset region having a width of 1 μm is provided.

A planarization insulating film may be formed over the transistor 410. The planarization insulating film can be formed using a heat-resistant organic material such as acrylic, polyimide, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. Note that the planarization insulating layer may be formed by stacking a plurality of insulating films formed of these materials.

In this manner, by using the highly-purified and intrinsic oxide semiconductor layer 403, the off-state current of the transistor can be sufficiently reduced.

The transistor 410 manufactured in this embodiment has the highly-purified oxide semiconductor layer 403, and thus provides an off-state current of $1\times10^{-13}$ A or smaller. In such a case, it is difficult to precisely measure the value of the off-state current of a transistor such as that manufactured in this embodiment, with a conventional technique for measuring off-state current whose lowest detection limit is approximately 10 fA.

In the current measurement method described in this embodiment, current is not directly measured; instead, current is measured by measuring a change in potential through time, thereby allowing minute current to be measured. This enables the measurement of a current of 10 fA or smaller, which has been difficult to achieve, for example, the measurement of current density of even 1 zA/μm or smaller. By using the above current measurement method as an inspection method and employing it in the manufacturing process of a transistor, an inspection is conducted to determine whether or not the transistor has predetermined characteristics, and defects in the transistor can be detected accurately. Further, a semiconductor device having preferred characteristics can be manufactured by determining the parameters of the transistor on the basis of current values obtained by the current measurement method described in the above embodiments.

The structures, methods, and the like described in this embodiment can be combined with any of the structures, methods, and the like described in the other embodiments as appropriate.

EXAMPLE 1

In this example, the results of current measurement actually carried out using one embodiment of the disclosed invention are shown. Note that in this example, current measurement was performed with a measurement system in FIG. 11 having three parallel-connected measurement systems each of which is one illustrated in FIG. 6. Further, in this example, an electrical element was a transistor including a highly-purified oxide semiconductor, whose channel length L and channel width W are 10 μm and 50 μm, respectively, and the off-state current of the transistor was measured. In addition, the parallel-connected measurement systems had capacitors whose capacitances were 100 fF, 1 pF, and 3 pF, respectively.

The relation among potentials were decided according to the timing chart of FIG. 7B. Note that VDD was 5 V and VSS was 0 V in the measurement of this example. In the measurement period, Vout was measured while the potential V1 was basically set to VSS and changed to VDD for 100 milliseconds at intervals of 10 seconds to 300 seconds.

Further, Δt which was used in calculation of current I flowing through the element was 30000 seconds.

Figure 15:
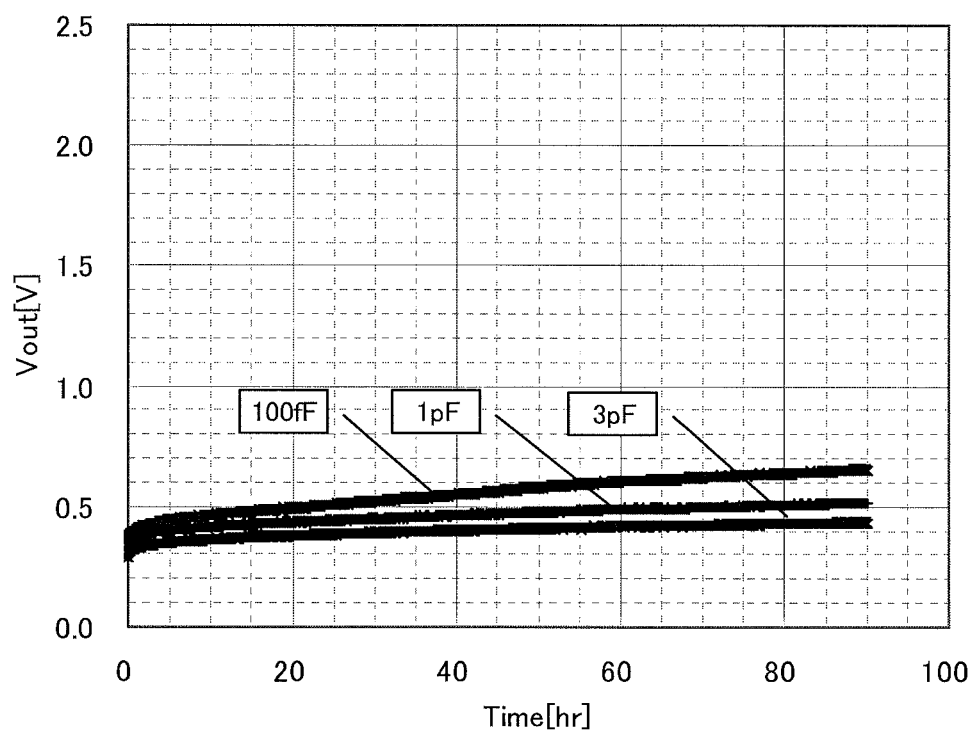
FIG. 15 is a graph showing a measurement result (a graph showing a relation between elapsed time Time and an output potential Vout)

FIG. 15 shows a relation between elapsed time Time in measurement of the current and the output potential Vout. The potential change can be observed after about 90 hours.

Figure 16:
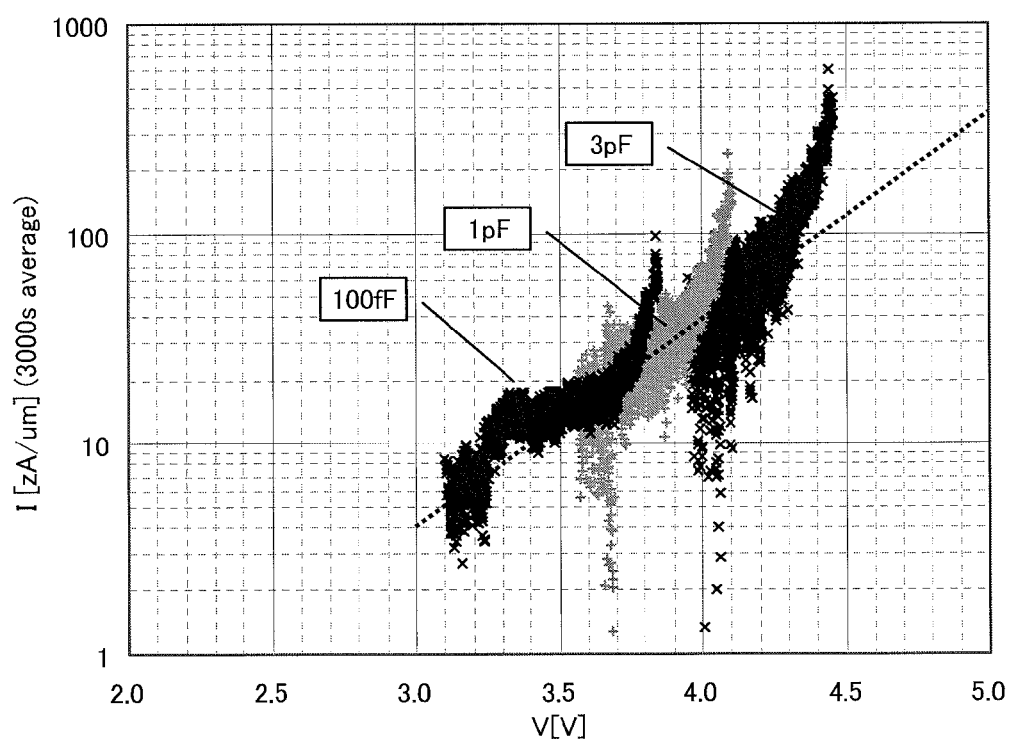
FIG. 16 is a graph showing a measurement result (a graph showing a relation between source-drain voltage V and off-state current I)

FIG. 16 shows the off-state current which was calculated in the above current measurement. FIG. 16 further shows a relation between source-drain voltage V and off-state current I. According to FIG. 16, it is found that off-state current is about 40 zA/μm under the condition that the source-drain voltage is 4 V. Note that 1 zA is $10^{-21}$ A.

EXAMPLE 2

In this example, the results of current measurement actually carried out using one embodiment of the disclosed invention are shown. In this example, a measurement system in FIG. 11 having three parallel-connected measurement systems each of which is one illustrated in FIG. 9 was prepared and current measurement was performed in a dark room at room temperature under a dry air atmosphere.

In this example, as a structure of the transistor 104 (transistor for evaluation) illustrated in FIG. 9, the structure of the transistor illustrated in FIG. 14C was employed. Note that in this example, an overlap region with a gate electrode was not provided in a source region and a drain region and a structure in which an offset region with a width of 1 μm was provided was employed.

In this example, as the transistor 105 and the transistor 106, transistors each including an oxide semiconductor having a channel length L of 3 μm and a channel width W of 100 μm were used. As the transistor 110 (transistor for injection of charge), a transistor including an oxide semiconductor having a channel length L of 10 μm and a channel width W of 10 μm was used. As the transistor 104 (transistor for evaluation), transistors each having one of the following six conditions were used.

TABLE 1

| | Channel length L [μm] | Channel width W [μm] |
|---|---|---|
| Condition 1 | 1.5 | $1 \times 10^5$ |
| Condition 2 | 3 | $1 \times 10^5$ |
| Condition 3 | 10 | $1 \times 10^5$ |
| Condition 4 | 1.5 | $1 \times 10^6$ |
| Condition 5 | 3 | $1 \times 10^6$ |
| Condition 6 | 10 | $1 \times 10^6$ |

Figure 17:
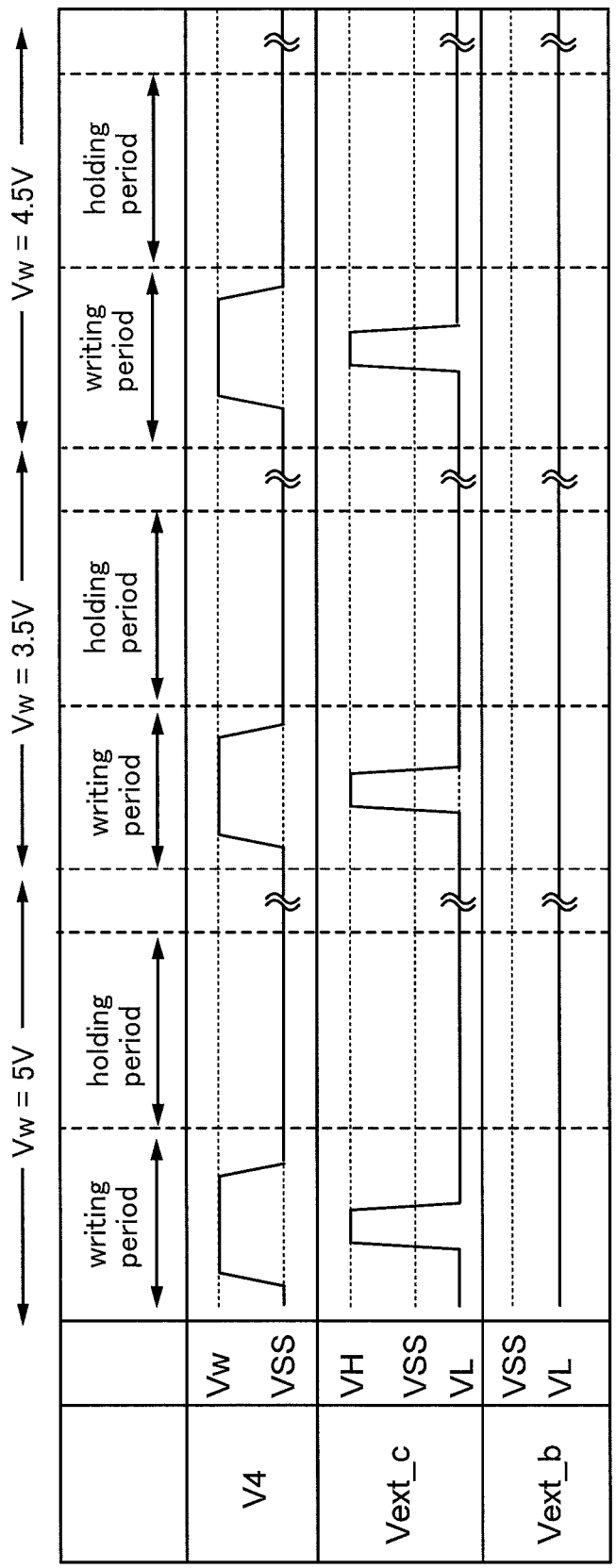
FIG. 17 is a view (timing chart) showing potentials relating to operation of a measurement system.

Measurement in this example was conducted in accordance with the timing chart in FIG. 17. First, writing operation with Vw=5 V and 1-hour holding were performed 15 times or more. Then, the transistors were confirmed to be basically in a steady state, and writing operation with Vw=3.5 V and 50-hour holding were performed twice. After that, writing operation with Vw=4.5 V and 10-hour holding were each performed once. Further, Δt which was used in calculation of the current I flowing through an element was approximately 54000 seconds.

Figure 18:
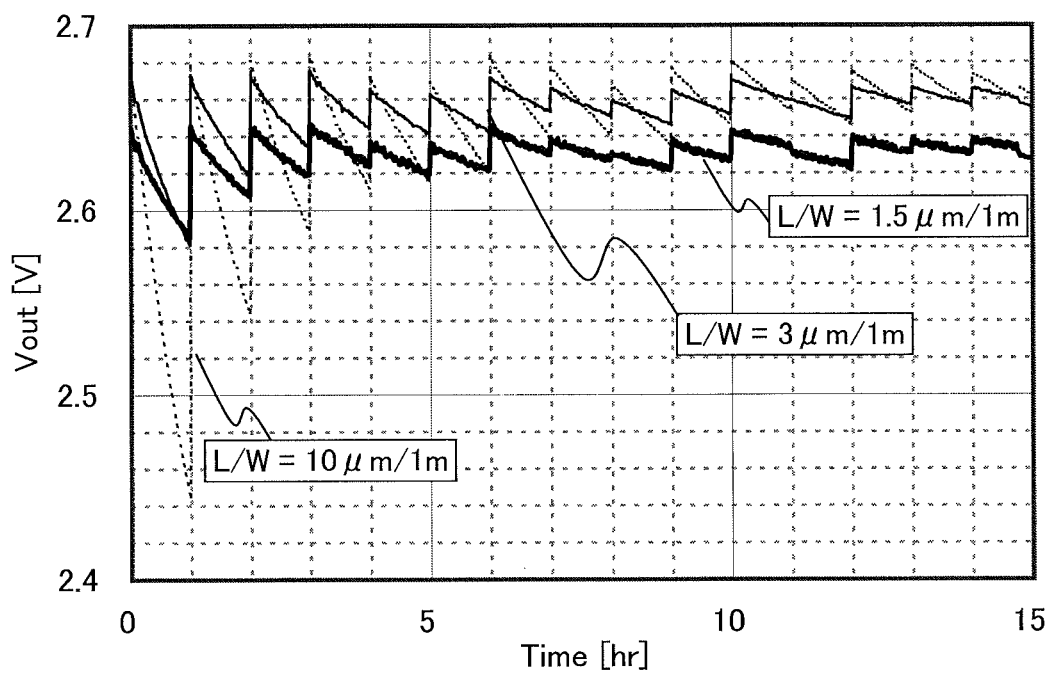
FIG. 18 is a graph showing a measurement result (a graph showing a relation between elapsed time Time and an output potential Vout)
Figure 19:
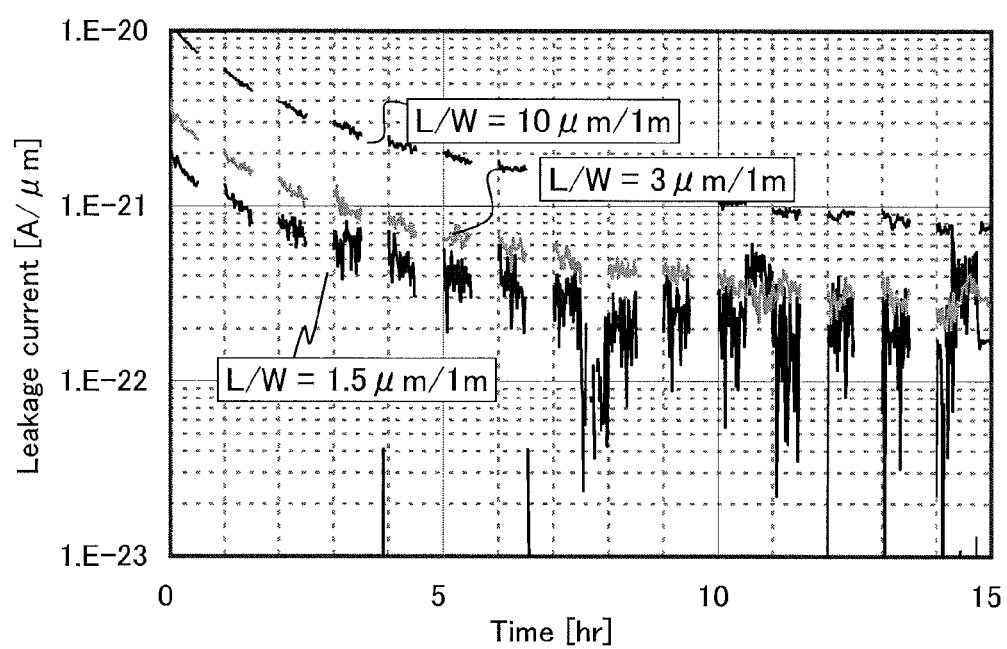
FIG. 19 is a graph showing a measurement result (a graph showing a relation between elapsed time Time and leakage current)

FIG. 18 shows a relation between the elapsed time Time in the above current measurement and the output potential Vout as the initial measurement results under the conditions 4, 5, and 6. FIG. 19 shows a relation between the elapsed time Time in the above current measurement and leakage current per channel width calculated from the current measurement. It is found that Vout is fluctuated after start of the measurement and that it takes 10 hours or longer to be in a steady state.

Figure 20:
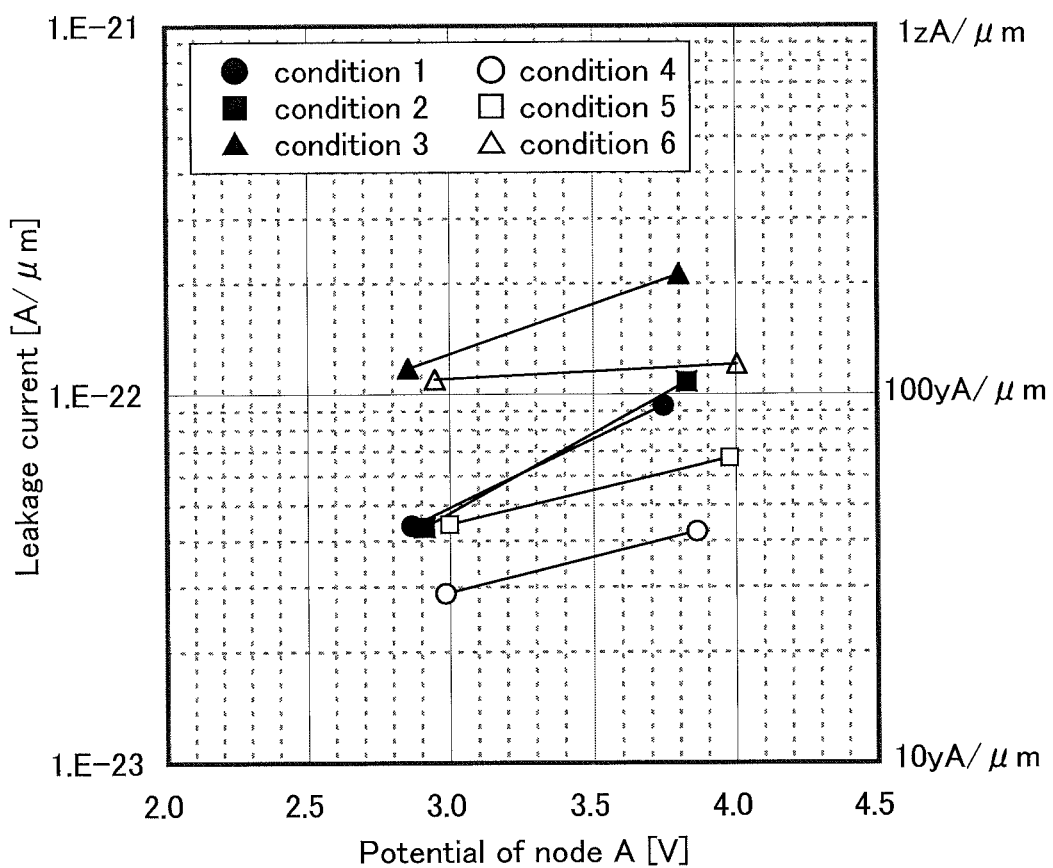
FIG. 20 is a graph showing a measurement result (a graph showing a relation between a potential of a node A and leakage current).

Further, FIG. 20 shows a relation between the potential of the node A and leakage current under the conditions 1 to 6, which is estimated based on the results of the current measurement. According to FIG. 20, under the condition 4, it can be found that the value is 28 yA/μm in the case where the voltage of the node A is 3.0 V.

This application is based on Japanese Patent Application serial no. 2010-094926 filed with Japan Patent Office on Apr. 16, 2010, the entire contents of which are hereby incorporated by reference.

What is claimed is:

1. A method for measuring current, comprising the steps of:
   applying a first potential to a first terminal of a transistor for evaluation;
   applying a second potential to a first terminal of a transistor for injection of charge;
   accumulating predetermined charge in a node where a second terminal of the transistor for evaluation and a second terminal of the transistor for injection of charge are connected to each other while the transistor for injection of charge is in an on state;
   turning off the transistor for injection of charge;
   measuring an amount of change in a potential of the node, due to change in an amount of the charge held in the node; and
   calculating a value of current flowing between the first terminal and the second terminal of the transistor for evaluation, from the amount of change in the potential.

2. The method for measuring current according to claim 1, wherein accumulation of predetermined charge in the node and measurement of the amount of change in the potential of the node is repeatedly performed.

3. The method for measuring current according to claim 1, wherein a transistor having L/W (L is a channel length and W is a channel width) larger than that of the transistor for evaluation is used as the transistor for injection of charge.

4. The method for measuring current according to claim 1, wherein a capacitor is connected to the node.

5. A method for inspecting a semiconductor device, wherein whether the transistor for evaluation has predetermined characteristics is inspected with the use of the method for measuring current according to claim 1.

6. A semiconductor device inspected by the method according to claim 5.

7. A semiconductor device, wherein a parameter of a transistor which is a component is determined based on data of the value of the current obtained with the use of the method for measuring current according to claim 1.

8. A test element group comprising:
   a transistor for evaluation;
   a transistor for injection of charge;
   a capacitor; and
   an output circuit,
   wherein a first terminal of the transistor for evaluation is a terminal to which a first potential is applied,
   wherein a first terminal of the transistor for injection of charge is a terminal to which a second potential is applied, and
   wherein a second terminal of the transistor for evaluation, a second terminal of the transistor for injection of charge, a first terminal of the capacitor, and an input terminal of the output circuit are connected to one another.

9. The test element group according to claim 8, wherein L/W (L is a channel length and W is a channel width) of the transistor for injection of charge is larger than that of the transistor for evaluation.

* * * * *

UNITED STATES PATENT AND TRADEMARK OFFICE
CERTIFICATE OF CORRECTION

PATENT NO.         : 8,552,712 B2                                    Page 1 of 1
APPLICATION NO.    : 13/085606
DATED              : October 8, 2013
INVENTOR(S)        : Kiyoshi Kato et al.

It is certified that error appears in the above-identified patent and that said Letters Patent is hereby corrected as shown below:

In the Specification

Column 5, line 24, after "TEG" insert --.--.

Column 11, line 40, before "state" replace "of" with --off--.

Column 13, line 7, after "small" insert --.--.

Column 18, lines 21-22, replace "farming" with --forming--.

Column 22, line 40, after "$1 \times 10^9$" replace "am" with --Ω·m--.

Column 24, line 18, after "lamp" insert --.--.

Signed and Sealed this
First Day of April, 2014

Michelle K. Lee
*Deputy Director of the United States Patent and Trademark Office*